US 7,759,831 B2

(12) United States Patent
Yagi

(10) Patent No.: US 7,759,831 B2
(45) Date of Patent: Jul. 20, 2010

(54) SWITCHING DEVICE, GENERATOR-MOTOR APPARATUS USING SWITCHING DEVICE, DRIVE SYSTEM INCLUDING GENERATOR-MOTOR APPARATUS, AND COMPUTER-READABLE RECORDING MEDIUM ON WHICH A PROGRAM FOR DIRECTING COMPUTER TO PERFORM CONTROL OF GENERATOR-MOTOR APPARATUS IS RECORDED

(75) Inventor: Katsunori Yagi, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 118 days.

(21) Appl. No.: 12/265,536

(22) Filed: Nov. 5, 2008

(65) Prior Publication Data

US 2009/0085446 A1  Apr. 2, 2009

Related U.S. Application Data

(62) Division of application No. 10/555,944, filed as application No. PCT/IB2004/002211 on Jul. 5, 2004, now Pat. No. 7,456,531.

(30) Foreign Application Priority Data

Jul. 24, 2003  (JP) .............................. 2003-200927

(51) Int. Cl.
 *H02K 11/00* (2006.01)
(52) U.S. Cl. ..................... 310/68 R; 310/68 C; 310/71; 310/365; 310/102 R; 318/471; 318/491; 318/538
(58) Field of Classification Search ................. 310/325, 310/365, 367, 370, 68 R, 68 C, 68 D, 69, 310/71, 102 R; 318/471, 472, 490, 491, 318/538; 257/688, 691, 696, 701
See application file for complete search history.

(56) References Cited

U.S. PATENT DOCUMENTS 3,559,001 A  1/1971  Cooper et al.

(Continued)

FOREIGN PATENT DOCUMENTS

EP  0 660 501 A1  6/1995

(Continued)

OTHER PUBLICATIONS

David G. Morrison: "Dual Thermal Paths Double Power Handling for Surface-Mount MOSFETs" Electronic Design, Jan. 21, 2002.

*Primary Examiner*—Bentsu Ro
*Assistant Examiner*—Thai Dinh
(74) *Attorney, Agent, or Firm*—Kenyon & Kenyon LLP

(57) ABSTRACT

A generator-motor apparatus includes a control circuit, an alternator, electrode plates, and switching devices. The electrodes plates have a substantial horseshoe shape, and are provided on an end surface of the alternator so as to surround a rotating shaft of the alternator. Each of the switching devices is formed by sandwiching a MOS transistor between two electrodes, and has a can structure for sealing the internal space of the switching device using a resin. The switching devices are directly attached to the electrode plate by means of soldering, and the switching devices are directly attached to the electrode plate by means of soldering. The control circuit controls the switching devices. The switching devices drive the alternator as an electric motor or an electric power generator.

14 Claims, 14 Drawing Sheets

U.S. PATENT DOCUMENTS

| | | | |
|---|---|---|---|
| 3,641,374 A * | 2/1972 | Sato | 310/68 D |
| 4,232,238 A * | 11/1980 | Saito et al. | 310/68 D |
| 5,331,239 A * | 7/1994 | Kwun et al. | 310/68 R |
| 5,686,780 A | 11/1997 | Adachi et al. | |
| 5,705,902 A | 1/1998 | Merritt et al. | |
| 6,002,219 A | 12/1999 | Permuy | |
| 6,040,626 A | 3/2000 | Cheah et al. | |
| 6,198,188 B1 * | 3/2001 | Ihata | 310/68 D |
| 6,396,127 B1 | 5/2002 | Munoz et al. | |
| 6,532,926 B1 | 3/2003 | Kuroda et al. | |
| 6,657,336 B2 * | 12/2003 | Morikaku et al. | 310/68 D |
| 6,713,888 B2 | 3/2004 | Kajiura | |
| 6,725,821 B2 | 4/2004 | Warren et al. | |
| 6,768,278 B2 | 7/2004 | Xu et al. | |
| 6,806,671 B2 | 10/2004 | Kusaka et al. | |
| 6,867,517 B2 * | 3/2005 | Kumagai | 310/68 D |
| 6,870,253 B1 | 3/2005 | Ushijima | |
| 6,882,047 B2 | 4/2005 | Hata et al. | |
| 2002/0053841 A1 | 5/2002 | Asao | |
| 2002/0158523 A1 | 10/2002 | Abadia et al. | |
| 2005/0258690 A1 | 11/2005 | Kusumi | |
| 2006/0087181 A1 | 4/2006 | Kusumi | |

FOREIGN PATENT DOCUMENTS

| | | |
|---|---|---|
| EP | 0 751 601 A2 | 1/1997 |
| EP | 1 059 426 A2 | 12/2000 |
| EP | 1 162 719 A2 | 12/2001 |
| EP | 1 184 905 A1 | 3/2002 |
| EP | 1557931 A1 * | 7/2005 |
| JP | 61-240666 | 10/1986 |
| JP | 63-202255 A | 8/1988 |
| JP | 02-305331 | 12/1990 |
| JP | 06-062553 A | 3/1994 |
| JP | 06-291223 | 10/1994 |
| JP | 07-184361 A | 7/1995 |
| JP | 08-331818 | 12/1996 |
| JP | 09-103001 | 4/1997 |
| JP | 09-260585 A | 10/1997 |
| JP | 10-056762 | 2/1998 |
| JP | 10-191691 A | 7/1998 |
| JP | 11-206183 A | 7/1999 |
| JP | 2000-058693 A | 2/2000 |
| JP | 2000-060105 A | 2/2000 |
| JP | 2000-114445 | 4/2000 |
| JP | 2002-115631 | 4/2002 |
| JP | 2002-325313 | 11/2002 |
| JP | 2003-124436 | 4/2003 |
| JP | 2003-125588 | 4/2003 |
| WO | WO 02/080338 A1 | 10/2002 |

* cited by examiner

SWITCHING DEVICE, GENERATOR-MOTOR APPARATUS USING SWITCHING DEVICE, DRIVE SYSTEM INCLUDING GENERATOR-MOTOR APPARATUS, AND COMPUTER-READABLE RECORDING MEDIUM ON WHICH A PROGRAM FOR DIRECTING COMPUTER TO PERFORM CONTROL OF GENERATOR-MOTOR APPARATUS IS RECORDED

This is a division of application Ser. No. 10/555,944 filed 7 Nov. 2005, now U.S. Pat. No. 7,456,531 which is a 371 national phase application of PCT/IB2004/002211 filed 5 Jul. 2004, claiming priority to Japanese Patent Application No. 2003-200927 filed 24 Jul. 2003, the contents of which are incorporated herein by reference.

FIELD OF THE INVENTION

The invention relates to a generator-motor apparatus having good mountability, a switching device used for the generator-motor apparatus, a drive system including the generator-motor apparatus, and a computer-readable recording medium on which a program for directing a computer to perform control of the generator-motor apparatus is recorded.

BACKGROUND OF THE INVENTION

Japanese Patent Laid-Open Publication No. JP-A-07-184361 discloses a vehicular generator-motor apparatus having both the function as a three-phase motor for starting an engine mounted in a vehicle and the function as a three-phase alternating current generator for charging a battery.

The above-mentioned vehicular generator-motor apparatus includes a motor-generator and an integrated rectifier. The motor-generator includes a magnetic rotor, a stator core, and a three-phase armature winding. The stator core is fixed to a housing of the motor-generator. The three-phase armature winding is winded around the stator core. The magnetic rotor rotates inside the perimeter of the three-phase armature winding winded around the stator core.

The integrated rectifier is fixed to an inner surface of a rear housing of the motor-generator. The integrated rectifier includes six MOS power transistors arranged on a silicon (Si) substrate.

The integrated rectifier controls an electric current supplied to the three-phase armature winding by performing switching control of the six MOS power transistors, thereby directing the motor-generator to serve as an electric motor. The integrated rectifier also converts an alternating voltage generated by the motor-generator using engine torque into a direct-current voltage, thereby directing the motor-generator to serve as an electric power generator.

The vehicular generator-motor apparatus is a motor-generator having the integrated rectifier for controlling driving of the motor generator provided on the end surface thereof.

The above-mentioned vehicular generator-motor apparatus, however, is not configured with consideration given to cooling of the MOS power transistors constituting the integrated rectifier. This leads to problems. For example, improving the heat resistance of the MOS power transistors leads to an increase in size of the integrated rectifier, resulting in deterioration of the mountability of the vehicular generator-motor apparatus.

Also, providing the integrated rectifier separately from the motor-generator leads to an increase in the number of wiring harnesses, resulting in deterioration of the mountability of the vehicular generator-motor apparatus.

DISCLOSURE OF THE INVENTION

It is an object of the invention to provide a generator-motor apparatus having good mountability.

It is another object of the invention to provide a switching device used for the generator-motor apparatus having good mountability.

It is still another object of the invention to provide a drive system including the generator-motor apparatus having good mountability.

It is yet another object of the invention to provide a computer-readable recording medium on which a program for directing a computer to perform control of the generator-motor apparatus having good mountability is recorded.

A first aspect of the invention relates to a switching device including a first electrode, a second electrode, a switching element and a sealing member. The switching element is electrically connected to the first electrode and the second electrode, and sandwiched between the first electrode and the second electrode. The sealing member is provided around the switching element, and contacts the first electrode and the second electrode.

In the switching device, the switching element is sandwiched between the two electrodes. The two electrodes dissipate heat generated by the switching element.

Accordingly, with the switching device, the switching element can be efficiently cooled. Preferably, the switching element is electrically connected to the first electrode and the second electrode by means of soldering.

Therefore, the step of wire bonding can be omitted, enabling improvement in productivity.

The switching element is preferably an N channel MOS transistor. In this case, the reverse polarity structure of the MOS transistor can be easily realized.

A second aspect of the invention relates to a generator-motor apparatus including a motor, a first electrode plate, a second electrode plate, and a multi-phase switching element group. The motor includes a rotor and a stator, and serves as an electric power generator and an electric motor. The first electrode plate and the second electrode plate are arranged on the end surface of the motor. The first electrode plate and the second electrode plate are formed in a substantial horseshoe shape, and surround a rotating shaft of the motor. The multi-phase switching element group controls an electric current supplied to the stator of the motor. The number of the multi-phase switching element groups corresponds to the number of phases of the motor. Each multi-phase switching element group includes a plurality of arms. Each arm includes a first switching device and a second switching device which are electrically connected to each other in series between the first electrode plate and the second electrode plate. A plurality of the first switching devices is directly attached to the first electrode plate, and a plurality of the second switching devices is directly attached to the second electrode plate. Each of the plurality of the first switching devices and the second switching devices includes a first electrode, a second electrode, a switching element electrically connected to the first electrode and the second electrode and sandwiched between the first electrode and the second electrode, and a sealing member which is provided around the switching element and which contacts the first electrode and the second electrode.

Accordingly, with the switching device, the size thereof can be reduced, and the switching element can be efficiently cooled. As a result, the mountability of the generator-motor apparatus can be improved.

Preferably, the generator-motor apparatus further includes a control circuit and a bus bar. The control circuit controls the multi-phase switching element group. The bus bar connects the plurality of the first switching devices and the plurality of the second switching devices to the control circuit. The bus bar is formed by insert molding.

In this case, reliability and productivity of the generator-motor can be improved.

Preferably, the generator-motor apparatus further includes a temperature sensor. The temperature sensor is provided inside the control circuit, and detects the temperature of the control circuit. The temperature of the control circuit actually detected by the temperature sensor is used for detecting the temperature of the switching element.

In this case, the number of the wire harnesses can be reduced, and the mountability of the generator-motor apparatus can be improved as compared to the case where a temperature sensor is provided in each of the plurality of the switching elements.

The temperature of the switching element is preferably detected by extracting the temperature of the switching element corresponding to the temperature of the control circuit actually detected by the temperature sensor, with reference to a map showing a relationship between the temperature of the control circuit and the temperature of the switching element.

In this case, the temperature of the switching element can be stably detected.

Preferably, the multi-phase switching element group controls a current supplied to the stator such that the motor outputs predetermined torque when an internal combustion engine is ignited. The motor outputs the predetermined torque, and transmits the predetermined torque to the internal combustion engine via a belt.

In this case, flexibility in the mounting of the generator-motor apparatus can be increased.

Preferably, the generator-motor apparatus further includes a control circuit and a temperature sensor. The control circuit controls the multi-phase switching element group. The temperature sensor is arranged on one of the first electrode plate and the second electrode plate, and detects the ambient temperature of the electrode plate on which the temperature sensor is arranged. The control circuit then detects the temperature of the switching element based on the ambient temperature actually detected by the temperature sensor.

In this case, the number of the wire harnesses can be reduced, and the mountability of the generator-motor apparatus can be improved as compared to the case where a temperature sensor is provided in each of the plurality of the switching elements.

Preferably, the control circuit stores a map showing a relationship between the ambient temperature and the temperature of the switching element, and detects the temperature of the switching element by extracting the temperature of the switching element corresponding to the ambient temperature actually detected by the temperature sensor using the map.

In this case, the temperature of the switching element can be stably detected.

A third aspect of the invention relates to a drive system including a generator-motor apparatus and a control device. The generator-motor apparatus starts an internal combustion engine, and generates electric power using engine torque. The control device controls the generator-motor apparatus. The generator-motor apparatus includes a motor, a first electrode plate, a second electrode plate, and a multi-phase switching element group. The motor includes a rotor and a stator, and serves as an electric power generator and an electric motor. The first electrode plate and the second electrode plate are arranged on the end surface of the motor. The first electrode plate and the second electrode plate are formed in a substantial horseshoe shape, and surround a rotating shaft of the motor. The multi-phase switching element group controls an electric current supplied to the stator of the motor. The number of the multi-phase switching element groups corresponds to the number of phases of the motor. Each multi-phase switching element group includes a plurality of arms. Each arm includes a first switching device and a second switching device which are electrically connected to each other in series between the first electrode plate and the second electrode plate. A plurality of the first switching devices is directly attached to the first electrode plate, and a plurality of the second switching devices is directly attached to the second electrode plate. Each of the plurality of the first switching devices and the second switching devices includes a first electrode, a second electrode, a switching element electrically connected to the first electrode and the second electrode and sandwiched between the first electrode and the second electrode, and a sealing member which is provided around the switching element and which contacts the first electrode and the second electrode. The control device outputs a signal for prohibiting an automatic stop of the internal combustion engine to an internal combustion engine control device for controlling the internal combustion engine, when the temperature of the switching element is higher than a predetermined temperature.

Accordingly, with the drive system, the mountability of the generator-motor apparatus can be improved, and the possibility, that the internal combustion engine cannot be started due to an increase in the temperature of the switching element included in the generator-motor apparatus, can be prevented.

A fourth aspect of the invention relates to a drive system including a generator-motor apparatus and a control device. The generator-motor apparatus starts an internal combustion engine, and generates electric power using engine torque. The control device controls the generator-motor apparatus. The generator-motor apparatus includes a motor, a first electrode plate, a second electrode plate, and a multi-phase switching element group. The motor includes a rotor and a stator, and serves as an electric power generator and an electric motor. The first electrode plate and the second electrode plate are arranged on the end surface of the motor. The first electrode plate and the second electrode plate are formed in a substantial horseshoe shape, and surround a rotating shaft of the motor. The multi-phase switching element group controls an electric current supplied to the stator of the motor. The number of the multi-phase switching element groups corresponds to the number of phases of the motor. Each multi-phase switching element group includes a plurality of arms. Each arm includes a first switching device and a second switching device which are electrically connected to each other in series between the first electrode plate and the second electrode plate. A plurality of the first switching devices is directly attached to the first electrode plate, and a plurality of the second switching devices is directly attached to the second electrode plate. Each of the first and second switching devices includes a first electrode, a second electrode, a switching element electrically connected to the first electrode and the second electrode and sandwiched between the first electrode and the second electrode, and a sealing member which is provided around the switching element and which contacts the first electrode and the second electrode. The control device controls the amount of electric power generated by the motor such that the temperature of the switching element becomes the temperature at which starting of the internal combustion engine is permitted.

Accordingly, with the drive system, the mountability of the generator-motor apparatus can be improved, and the possibility that the internal combustion engine cannot be started due to an increase in the temperature of the switching element included in the generator-motor apparatus can be prevented.

A fifth aspect of the invention relates to a computer-readable recording medium on which a program for directing a computer to perform control of a generator-motor apparatus for starting an internal combustion engine is recorded. The generator-motor apparatus includes a motor, a first electrode plate, a second electrode plate, and a multi-phase switching element group. The motor includes a rotor and a stator, and serves as an electric power generator and an electric motor. The first electrode plate and the second electrode plate are arranged on the end surface of the motor. The first electrode plate and the second electrode plate are formed in a substantial horseshoe shape, and surround a rotating shaft of the motor. The multi-phase switching element group controls an electric current supplied to the stator of the motor. The number of the multi-phase switching element groups corresponds to the number of phases of the motor. Each multi-phase switching element group includes a plurality of arms. Each arm includes a first switching device and a second switching device which are electrically connected to each other in series between the first electrode plate and the second electrode plate. A plurality of the first switching devices is directly attached to the first electrode plate, and a plurality of the second switching devices is directly attached to the second electrode plate. Each of the plurality of the first switching devices and the second switching devices includes a first electrode, a second electrode, a switching element electrically connected to the first electrode and the second electrode and sandwiched between the first electrode and the second electrode, and a sealing member which is provided around the switching element and which contacts the first electrode and the second electrode.

The program directs the computer to perform a first step for detecting the temperature of the switching element when the motor generates electric power, a second step for determining whether the detected temperature of the switching element is higher than a first reference value, and a third step for prohibiting an automatic stop of the internal combustion engine when the temperature of the switching element is higher than the first reference value.

Accordingly, with the recording medium the possibility of the internal combustion engine not being able to be started due to an increase in the temperature of the switching element included in the generator-motor apparatus can be prevented.

Preferably, the program directs the computer to further perform a fourth step for detecting the remaining capacity of a battery, a fifth step for determining whether the temperature of the switching element is higher than a second reference value when the temperature of the switching element is equal to or lower than the first reference value, a sixth step for determining whether the remaining capacity of the battery is larger than a reference capacity when the temperature of the switching element is higher than the second reference value, and a seventh step for limiting the amount of electric power generated by the motor such that the temperature of the switching element becomes equal to or lower than the second reference value when the remaining capacity of the battery is larger than the reference capacity.

In this case, it is possible to prevent the possibility that the internal combustion engine cannot be started due to an increase in the temperature of the switching element included in the generator-motor apparatus.

Preferably, the program directs the computer to further perform an eighth step for lighting an alarm light when the remaining capacity of the battery does not increase even if a predetermined time has elapsed since the motor starts electric power generation.

In this case, it is possible to prevent the possibility that the internal combustion engine cannot be started due to an increase in the temperature of the switching element included in the generator-motor apparatus.

BRIEF DESCRIPTION OF THE DRAWINGS

The foregoing and further objects, features and advantages of the invention will become apparent from the following description of preferred embodiments with reference to the accompanying drawings, wherein like numerals are used to represent like elements and wherein.

DETAILED DESCRIPTION OF THE PREFERRED EMBODIMENTS

Figure 1:
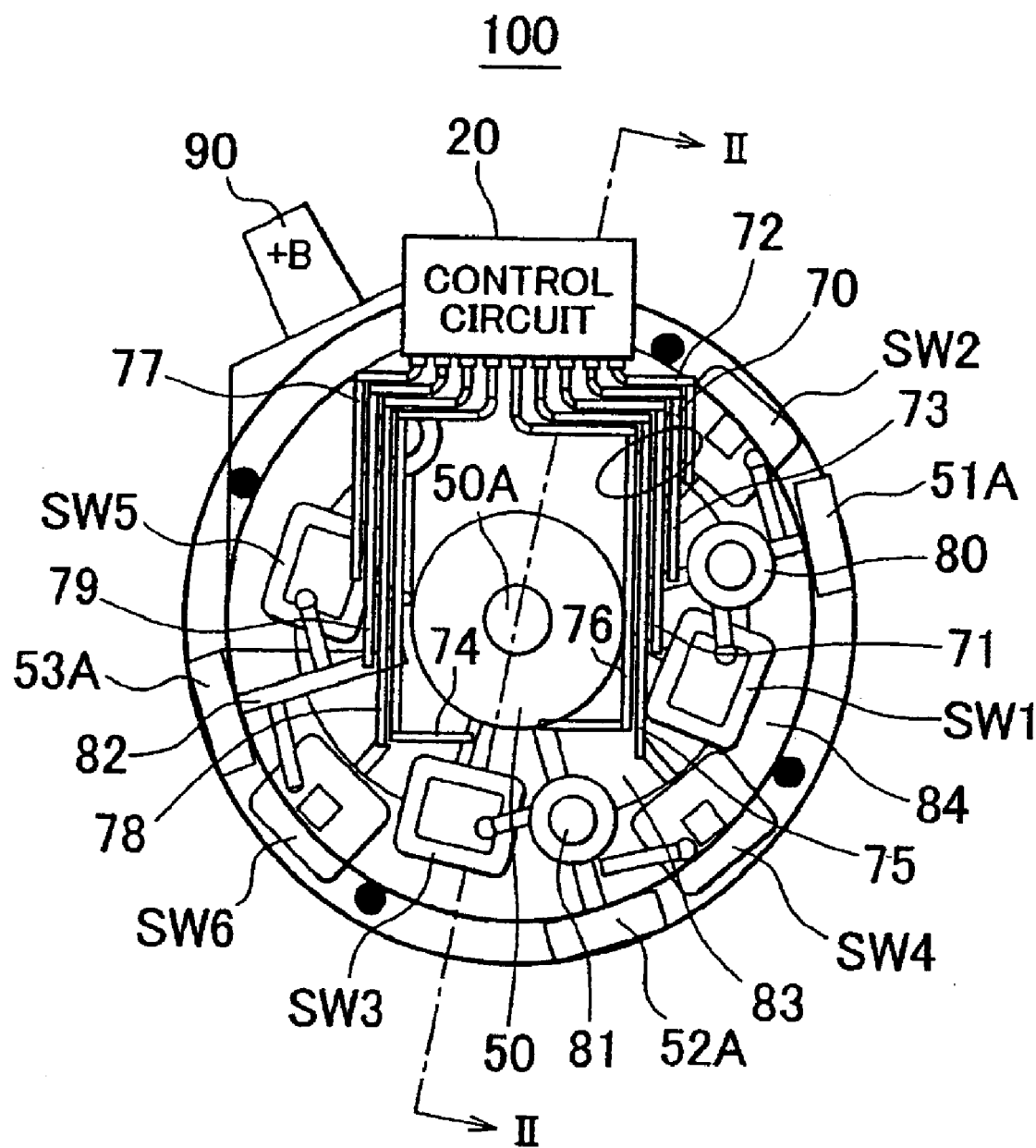
FIG. 1 is a plan view of a generator-motor apparatus according to an embodiment of the invention.

Hereafter, an embodiment of the invention will be described in detail with reference to accompanying drawings. The same portions or substantially the same portions in the drawings will be denoted with the same reference numerals and characters, and description thereof will be given only once.

Referring to FIG. 1, a generator-motor apparatus 100 according to the embodiment includes switching devices SW1 to SW6, a control circuit 20, an alternator 50, a bus bar 70 and electrode plates 83 and 84.

The electrode plates 83 and 84 have a substantial horseshoe shape, and are provided on an end surface of the alternator 50 so as to surround a rotating shaft 50A of the alternator 50. The electrode plates 83 and 84 are made of copper (Cu). The electrode plate 83 is connected to a terminal 90 to which a power supply voltage is supplied from a battery (not shown). The electrode plate 84 is connected to an earth node.

The control circuit 20 is provided on the end surface of the alternator 50 and a notch portion of the electrode plates 83 and 84.

The switching devices SW1, SW3 and SW5 are directly attached to the electrode plate 83 by means of soldering. The switching devices SW2, SW4 and SW6 are directly attached to the electrode plate 84 by means of soldering.

The bus bar 70 includes wires 71 to 79 and connection portions 80 to 82. The wire 71 has one end connected to the control circuit 20 and the other end connected to a gate of the switching device SW1. The wire 72 has one end connected to the control circuit 20 and the other end connected to a gate of the switching device SW2. The wire 73 connects the connection portion 80 to the control circuit 20.

The wire 74 has one end connected to the control circuit 20 and the other end connected to a gate of the switching device SW3. The wire 75 has one end connected to the control circuit 20 and the other end connected to a gate of the switching device SW4. The wire 76 connects the connection portion 81 to the control circuit 20.

The wire 77 has one end connected to the control circuit 20 and the other end connected to a gate of the switching device SW5. The wire 78 has one end connected to the control circuit 20 and the other end connected to a gate of the switching device SW6. The wire 79 connects the connection portion 82 to the control circuit 20.

The connection portion 80 connects a source of the switching device SW1, a drain of the switching device SW2, and a terminal 51A to each other. The connection portion 81 connects a source of the switching device SW3, a drain of the switching device SW4, and a terminal 52A to each other. The connection portion 82 connects a source of the switching device SW5, a drain of the switching device SW6, and a terminal 53A to each other. The terminal 51A, the terminal 52A, and the terminal 53A are used for exchanging electric power with a U-phase coil, a V-phase coil, and a W-phase coil of the alternator 50, respectively.

The switching device SW1 and the switching device SW2 are electrically connected to each other in series between the electrode plate 83 and the electrode plate 84 by the connection portion 80. The switching device SW3 and the switching device SW4 are electrically connected to each other in series between the electrode plate 83 and the electrode plate 84 by the connection portion 81. The switching device SW5 and the switching device SW6 are electrically connected to each other in series between the electrode plate 83 and the electrode plate 84 by the connection portion 82.

The connection portion 80 receives a waveform of electricity, which is generated by the U-phase coil when the alternator 50 serves as an electric power generator, from the U-phase coil via the terminal 51A, and outputs the received wave form to the control circuit 20 via the wire 73. Similarly, the connection portion 81 receives a wave form of electricity generated by the V-phase coil from the V-phase coil via the terminal 52A, and outputs the received wave form to the control circuit 20 via the wire 76.

The control circuit 20, as described later in detail, controls the switching devices SW1 to SW6, the alternator 50, and the like.

Figure 2:
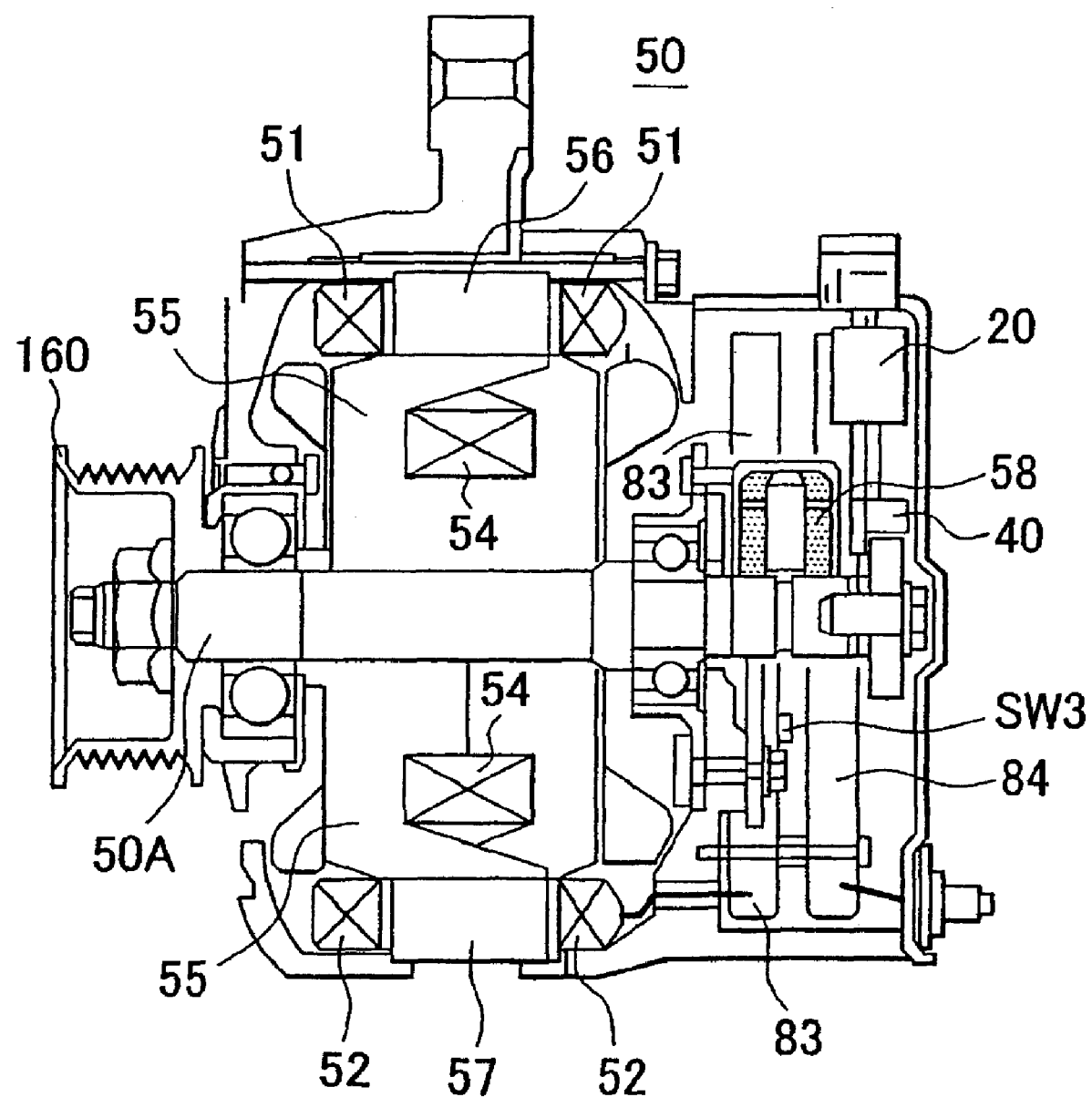
FIG. 2 is a cross sectional view taken along line II-II in FIG. 1.

FIG. 2 is a cross sectional view of the alternator 50, taken along line II-II in FIG. 1. Referring to FIG. 2, a rotor 55 is fixed to the rotating shaft 50A, and a rotor coil 54 is winded around the rotor 55. Stators 56 and 57 are fixed to the outside of the rotor 55, a U-phase coil 51 is winded around the stator 56, and a V-phase coil 52 is winded around the stator 57. In FIG. 2, the stator around which a W-phase coil is winded is not shown.

A pulley 160 is coupled to one end of the rotating shaft 50A. This structure allows the torque generated by the alternator 50 to be transmitted to a crankshaft of an engine via a belt, and the engine torque from the crankshaft of the engine to be transmitted to the rotating shaft 50A.

At one end of the rotating shaft 50A, which is on the opposite side of the end to which the pulley 160 is coupled, the electrode plates 83 and 84 are provided so as to surround the rotating shaft 50A. A brush 58 is provided so as to contact the rotating shaft 50A.

A position detecting device 40 is provided in the region which is on the right side with respect to the electrode plate 84 and on the upper side with respect to the rotating shaft 50A in FIG. 2. The control circuit 20 is provided on the upper side of the position detecting device 40. The switching device SW3 is fixed to the surface of the electrode plate 83 facing the electrode plate 84.

Figure 3:
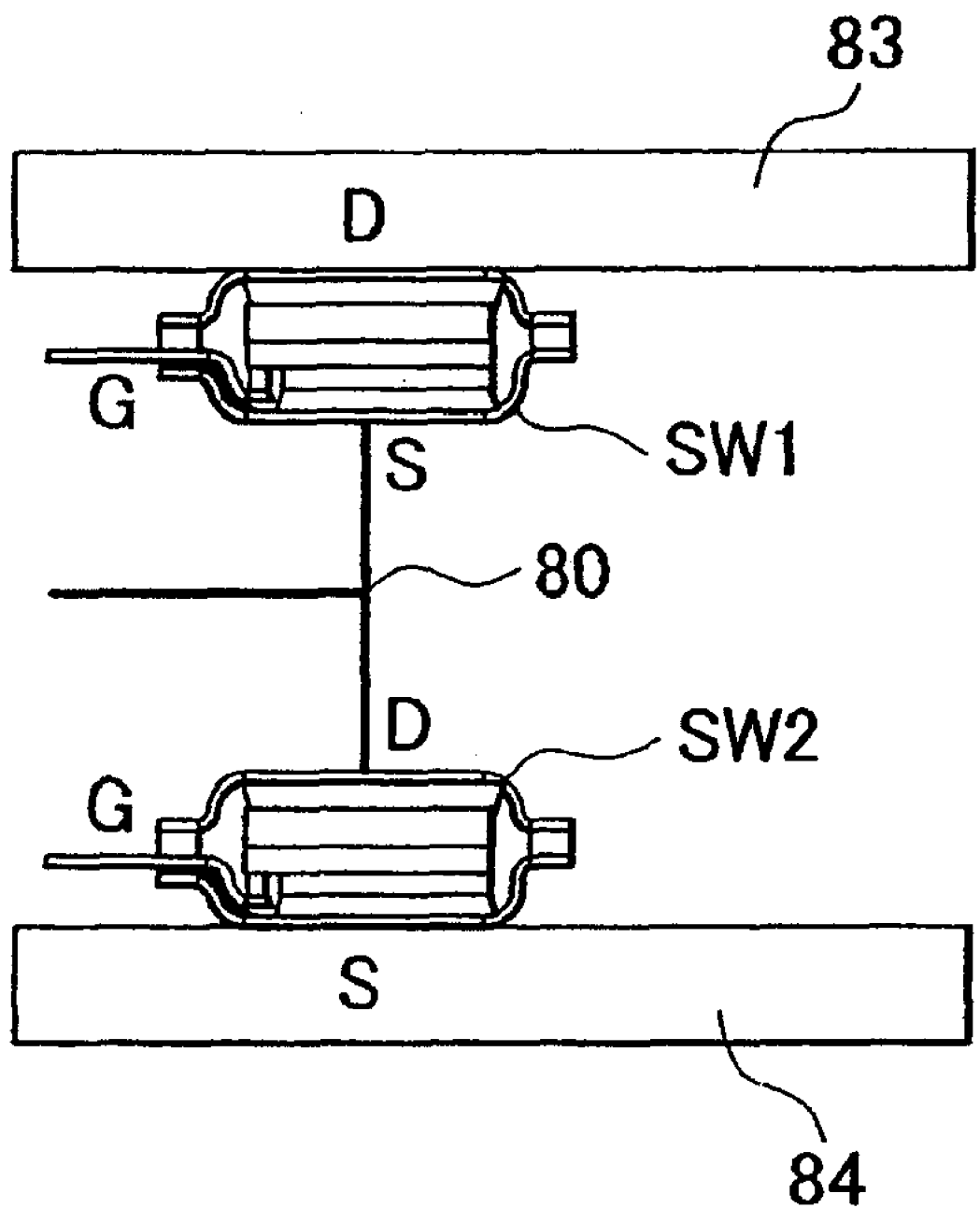
FIG. 3 is a cross sectional view of a region where a switching device SW1, and a switching device SW2 shown in FIG. 1 are arranged.

FIG. 3 is a cross sectional view of the region where the switching devices SW1 and SW2 shown in FIG. 1 are provided. Referring to FIG. 3, the switching device SW1 and the switching device SW 2 are electrically connected to each other in series between the electrode plate 83 and the electrode plate 84. The drain of the switching device SW1 is attached to the electrode plate 83 by means of soldering, allowing the switching device SW1 to be directly attached to the electrode plate 83. The source of the switching device SW2 is attached to the electrode plate 84 by means of soldering, allowing the switching device SW2 to be directly attached to the electrode plate 84. The source of the switching device SW1 is connected to the drain of the switching device SW2 by the connection portion 80.

In the same manner in which the switching device SW1 and the switching device SW2 are connected to each other, the switching device SW3 and the switching device SW4 are electrically connected to each other in series between the electrode plate 83 and the electrode plate 84, and the switching device SW5 and the switching device SW6 are electrically connected to each other in series between the electrode plate 83 and the electrode plate 84.

Figure 4:
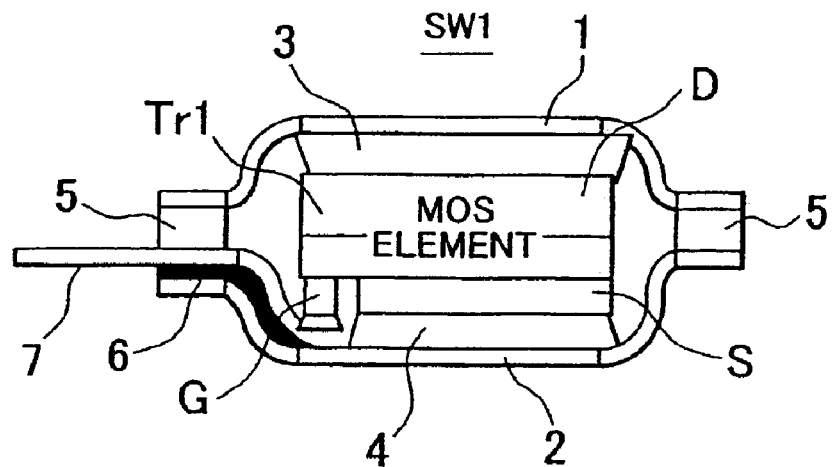
FIG. 4 is a cross sectional view of the switching device SW1 shown in FIG. 1.

FIG. 4 is a cross sectional view of the switching device SW1 shown in FIG. 1. Referring to FIG. 4, the switching device SW1 includes a MOS transistor Tr1, electrodes 1 and 2, a resin 5, an insulation pad 6, and a wire 7. The MOS transistor Tr1 is an N channel MOS transistor.

The electrodes 1 and 2 are made of copper (Cu). The electrode 1 forms the positive electrode, and the electrode 2 forms the negative electrode. The electrode 1 has a shape symmetrical to that of the electrode 2. The electrode 1 and the electrode 2 sandwich the MOS transistor Tr1. In this case, a drain D of the MOS transistor Tr1 is electrically connected to the electrode 1 by solder 3, and a source S is electrically connected to the electrode 2 by solder 4. A gate G is electrically connected to the wire 7 by means of soldering. The wire 7 is insulated from the electrode 2 by the insulation pad 6.

The resin 5 is formed of a silicon (Si) resin. The resin 5 is provided in peripheral portions of the electrode 1 and the electrode 2 sandwiching the MOS transistor Tr1, so as to contact the electrodes 1 and 2, thereby sealing the MOS transistor Tr1. In this case, the wire 7 connected to the gate of the MOS transistor Tr1 extends to the outside of the region sealed by the electrodes 1 and 2, and the resin 5.

The electrode 1 is made of metal (Cu). The electrode 1 is connected to the drain D of the MOS transistor Tr1 by the solder 3. This structure allows the electrode 1 to serve as a drain electrode of the switching device SW and a cooling fin. The electrode 2 is made of metal (Cu). The electrode 2 is connected to the source S of the MOS transistor Tr1 by the solder 4. This structure allows the electrode 2 to serve as a source electrode of the switching device SW1 and a cooling fin.

Accordingly, heat generated by the MOS transistor Tr1 is transferred to the electrode 1 via the drain D and the solder 3, transferred to the electrode 2 via the source S and the solder 4, and then dissipated from the electrodes 1 and 2.

As described above, the switching device SW1 is sandwiched between the two electrodes 1 and 2, and is configured such that the heat generated by the MOS transistor Tr1 is dissipated easily.

The resin 5 insulates the electrode 1 and the electrode 2 from each other, and protects the MOS transistor from getting wet.

Each of the switching devices SW2 to SW6 has the same structure as that of the switching device SW1. Note that the structure shown in FIG. 4 is referred to as the "can structure". By manufacturing the switching devices SW1 to SW6 using the "can structure", the switching device having reverse polarity can be manufactured only by vertically reversing the arrangement of the switching devices SW1 to SW6, instead of by changing the MOS transistors Tr1 to Tr6 from the N channel MOS transistors to the P channel MOS transistors. Namely, the "can structure" allows the polarity to be reversed easily.

The switching devices SW1 to SW6 are configured such that the embedded MOS transistors are easily cooled. The switching devices SW1, SW3 and SW5 are fixed to the electrode plate 83 by the drain D, and the switching devices SW2, SW4 and SW6 are fixed to the electrode plate 84 by the source S. The electrode plates 83 and 84 are arranged at the rear portion of the alternator 50, that is, the portion which is on the opposite side of the portion at which the pulley 160 is arranged.

Therefore, the electrode plates 83 and 84 are cooled by the air flow taken in the alternator 50. In this case, since each of the switching devices SW1 to SW6 is configured by sandwiching the MOS transistor between the two electrodes (metal), the electrode 1 or the electrode 2 which is not connected to the electrode plate 83 or the electrode plate 84 is cooled together with the electrode plates 83 and 84.

Namely, in the switching devices SW1, SW3 and SW5, the heat generated by the MOS transistor Tr1 is transferred to the electrode 1 or the electrode 2 via the drain D or the source S, and then transferred to the electrode plate 83 from the electrode 1. The heat transferred to the electrode 2 and the electrode plate 83 is then cooled by the air flow taken in the alternator 50. In the switching devices SW2, SW4 and SW6, the heat generated by the MOS transistor Tr1 is transferred to the electrode 1 or the electrode 2 via the drain D or the source S, and then transferred to the electrode plate 84 from the electrode 2. The heat transferred to the electrode 1 and the electrode plate 84 is cooled by the air flow taken in the alternator 50.

When the switching devices SW1 to SW6 are fixed to the end surface of the alternator 50, each of the switching devices SW1 to SW6 is cooled by one of the electrode plates 83 and 84, and one of the electrodes 1 and 2.

This eliminates the need for an additional device or the like for cooling switching devices SW1 to SW6. As a result, the switching devices SW1 to SW6 can be efficiently cooled with a compact structure, and the mountability can be improved when the generator-motor apparatus 100 is mounted in the vehicle.

Figure 5:
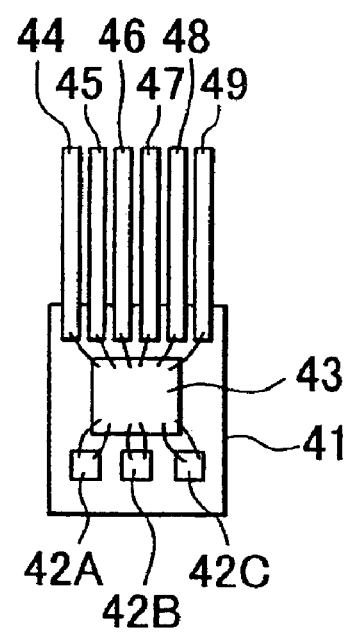
FIG. 5 is a plan view of a position detecting device shown in FIG. 2.

FIG. 5 is a plan view of the position detecting device 40 shown in FIG. 2. Referring to FIG. 5, the position detecting device 40 includes a substrate 41, hall elements 42A, 42B and 42C, a circuit portion 43, and terminals 44 to 49.

The substrate 41 is made of silicon (Si). The hall elements 42A, 42B and 42C are arranged on the substrate 41 on a certain periphery at regular intervals. The circuit portion 43 is also provided on the substrate 41.

The hall elements 42A, 42B and 42C detect a position detection signal showing the position of a magnetic pole of the rotor 55 of the alternator 50, and outputs the detected position detection signal to the circuit portion 43. This position detection signal has a sine waveform.

The terminal 44 receives a power supply voltage. The terminal 49 is connected to the earth node. The terminal 48 receives a reference value used for converting the position detection signals from the hall elements 42A, 42B and 42C from sine waveforms into rectangle waveforms. The terminals 45 to 47 output the position detection signals having a rectangle waveform obtained by the circuit portion 43 to the control circuit 20.

The circuit portion 43 receives position detection signals θu, θv, and θw showing the magnetic pole positions of the U-phase, the V-phase and the W-phase from the hall elements 41A, 42B, and 42C, respectively, and receives the reference value from the terminal 48. The circuit portion 43 then performs waveform shaping of the received position detection signals θu, θv, and θw, amplifies them, and converts them into the position detection signals Hu, Hv, and Hw having a rectangle waveform, using the reference value received through the terminal 48. The circuit portion 43 then outputs the position detection signals Hu, Hv, and Hw to the control circuit 20 via the terminals 45, 46 and 47, respectively.

In the embodiment, the position detecting device 40 is manufactured as one IC having the substrate 41, the hall elements 42A, 42B and 42C, and the circuit portion 43 in one package, and having terminals 44 to 49.

Accordingly, the size of the generator-motor apparatus 100 can be reduced as compared to the case where the three hall elements are arranged at intervals of 30 electrical degrees on a printed substrate, enabling improvement in the mountability of the generator-motor apparatus 100.

Figure 6:
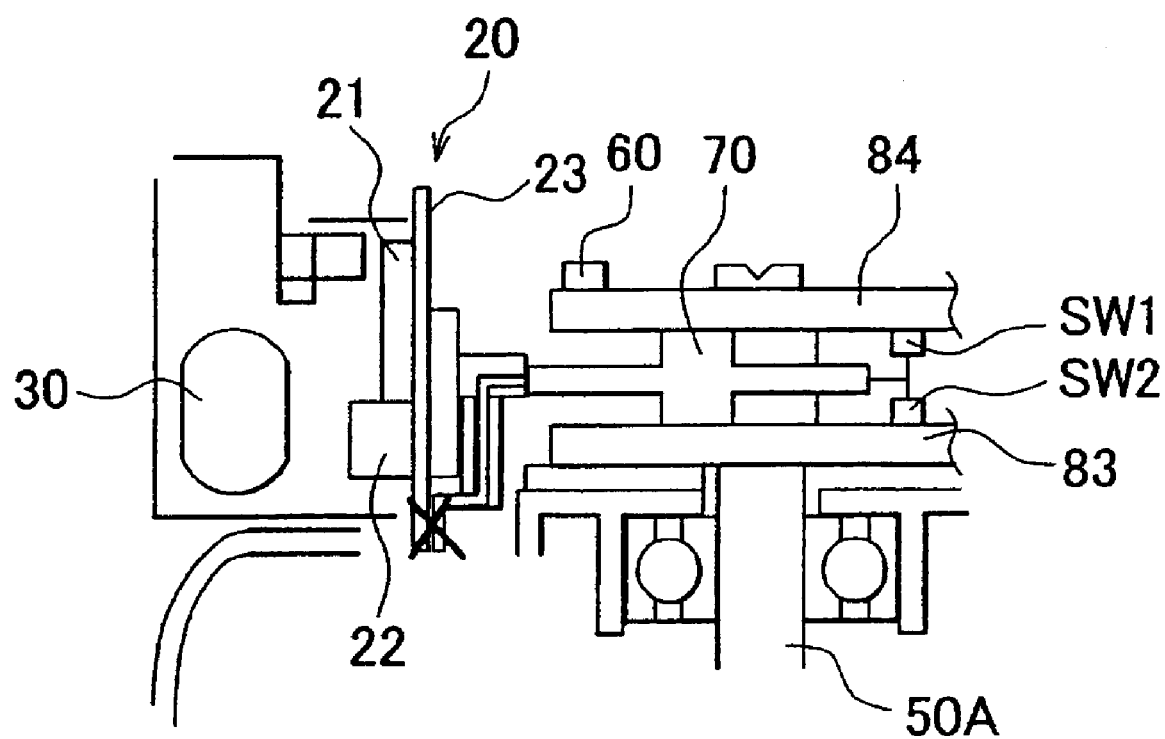
FIG. 6 is a cross sectional view for describing a method of connecting a control circuit shown in FIG. 2 to the switching devices.

FIG. 6 is a cross sectional view for describing a method of connecting a control circuit 20 shown in FIG. 2 to switching devices SW1 and SW2. Referring to FIG. 6, the control circuit 20 includes a control IC 21, an exciting transistor 22, and a substrate 23. The control IC 21 and the exciting transistor 22 are arranged on the substrate 22.

The bus bar 70 is formed by insert molding. Namely, the bus bar 70 is manufactured by placing the wires 71 to 79 shown in FIG. 1 in a die and performing molding using a resin. The bus bar 70 is then arranged between the electrode plate 83 and the electrode plate 84. One end of the bus bar 70 is connected to the substrate 23 of the control circuit 20 by TIG welding, and the other end is connected to the switching devices SW1, SW2, and the like.

A temperature sensor 60 is arranged on the electrode plate 84. A condenser 30 is arranged near the control circuit 20.

The condenser 30 is connected to the input side of the switching devices SW1 to SW6, and removes a ripple current. The temperature sensor 60 detects the ambient temperature of the electrode plate 84, and outputs the detected temperature to the control IC 21 of the control circuit 20.

The control IC 21 outputs a control signal through the bus bar 70 so as to control the switching devices SW1, SW2, and the like. The control IC 21 also receives the waveform of electricity generated by the alternator 50 through the bus bar 70, and determines whether the alternator 50 actually generates electric power.

The control IC 21 controls the exciting transistor 22 so as to control an electric current supplied to the rotor coil 54 of the alternator 50. Namely, the control IC 21 controls the amount of electric power generated by the alternator 50.

Further, the control IC 21 estimates the element temperature of the MOS transistor included in each of the switching devices SW1 to SW6 based on the temperature detected by the temperature sensor 60. The control IC 21 stores a map showing a relationship between the ambient temperature of the temperature sensor 60 and the element temperature. The control IC 21 extracts the element temperature corresponding to the ambient temperature actually detected by the temperature sensor 60 from the map, and estimates the element temperature.

As described above, the ambient temperature of the electrode plate 84 is measured and the element temperature is estimated, instead of directly measuring the element temperature of each of the switching devices SW1 to SW6. This reduces the number of the wire harnesses connected to the control circuit 20, enabling improvement in the mountability of the generator-motor apparatus 100.

The control IC 21 also has other functions, which will be described later. The temperature sensor 60 may be arranged on the electrode plate 83. Namely, it is sufficient that the temperature sensor 60 be arranged on only one of the two electrode plates 83 and 84.

Figure 7:
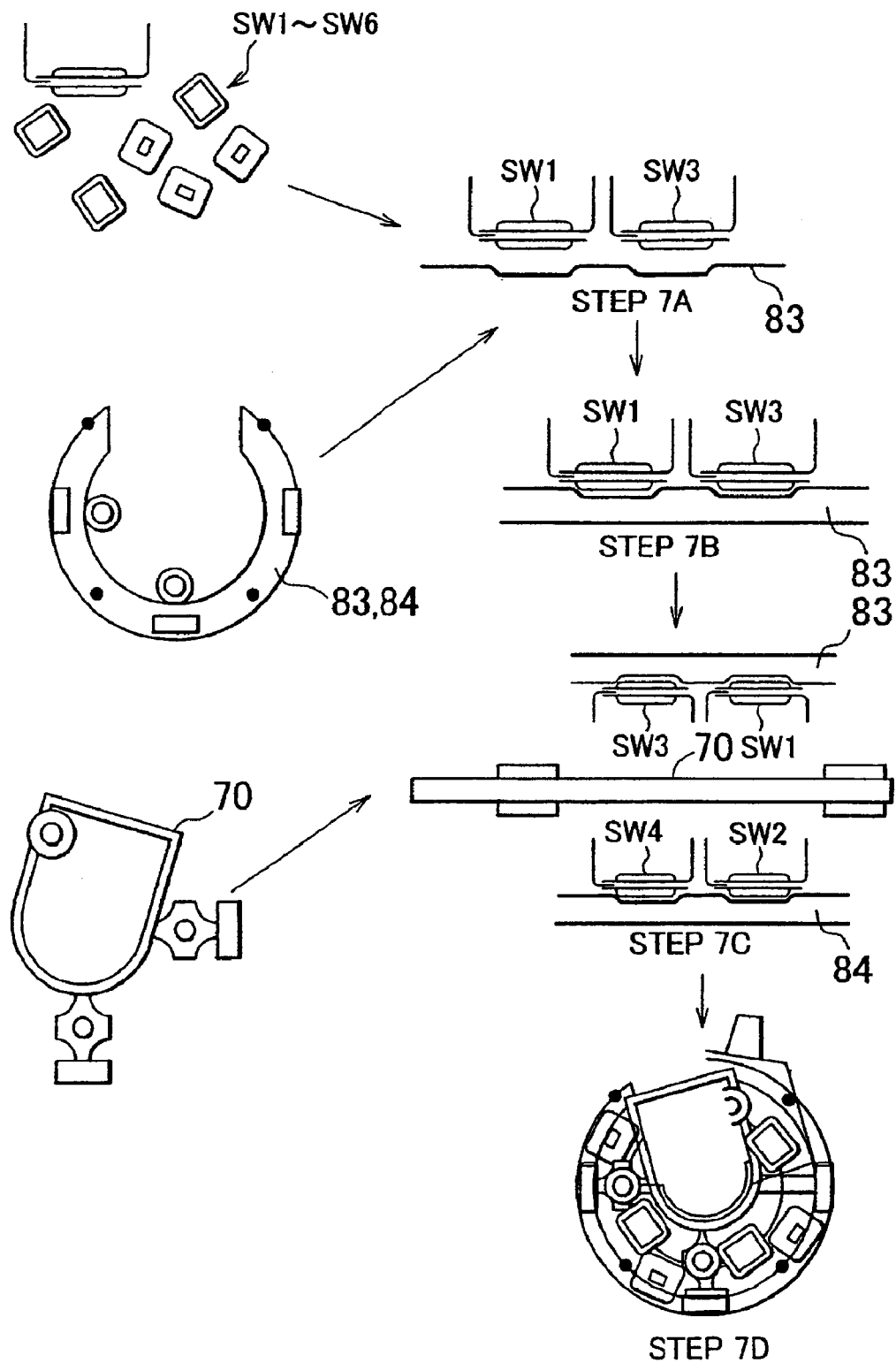
FIG. 7 is a procedural flow chart for fixing the switching devices and electrode plates to an end surface of an alternator.

FIG. 7 is a procedural flow chart for fixing the switching devices SW1 to SW6 and the electrode plates 83 and 84 to the end surface of an alternator 50. Referring to FIG. 7, the switching devices SW1 to SW6 having the above-mentioned "can structure", and the electrode plates 83 and 84 having a substantial horseshoe shape are prepared. Then, the switching devices SW1 and SW3 are fixed to one surface of the electrode plate 83 by means of soldering (refer to step 7A in FIG. 7). In this case, the switching device SW5 is also fixed to the electrode plate 83 by means of soldering (this step is not shown in step 7A in FIG. 7). The switching devices SW2, SW4, and SW6 are fixed to one surface of the electrode plate 84 by means of soldering.

The electrode plate 83 with the switching devices SW1, SW3 and SW5 soldered to one surface thereof is then placed in an oven with a weight. The switching devices SW1, SW3 and SW5, and the electrode plate 83 are then heated (refer to step 7B in FIG. 7). This step increases adhesion between the switching devices SW1, SW3, and SW5, and the electrode plate 83. In this case, the electrode plate 84 with the switching devices SW2, SW4 and SW6 soldered to one surface thereof is also placed in the oven with a weight. The switching devices SW2, SW4 and SW6, and the electrode plate 84 are then heated.

Then, the electrode plates 83 and 84 are supported such that the switching devices SW1, SW3, and SW5 face the switching devices SW2, SW4 and SW6, respectively. The bus bar 70 formed by insert molding is arranged between the electrode plate 83 and the electrode plate 84. The wires 71, 72, 74, 75, 77 and 78 included in the bus bar 70 are connected to the gates of the switching devices SW1 to SW6, respectively. The connection portion 80 is connected to the source of the switching device SW1, the drain of the switching device SW2, and the terminal 51A. The connection portion 81 is connected to the source of the switching device SW3, the drain of the switching device SW4, and the terminal 52A. The connection portion 82 is connected to the source of the switching device SW5, the drain of the switching device SW6, and the terminal 53A (refer to step 7C in FIG. 7).

Then, the switching devices SW1, SW3, and SW5, the electrode plate 83, the switching devices SW2, SW4, and SW6, and the electrode plate 84 connected with each other by the bus bar 70 are fixed to the end surface of the alternator 50 (refer to step 7D in FIG. 7). The control circuit 20 is then arranged in the notch portion of the electrode plates 83 and 84. One end of the bus bar 70 is connected to the substrate 23 of the control circuit 20 by TIG welding.

Figure 8:
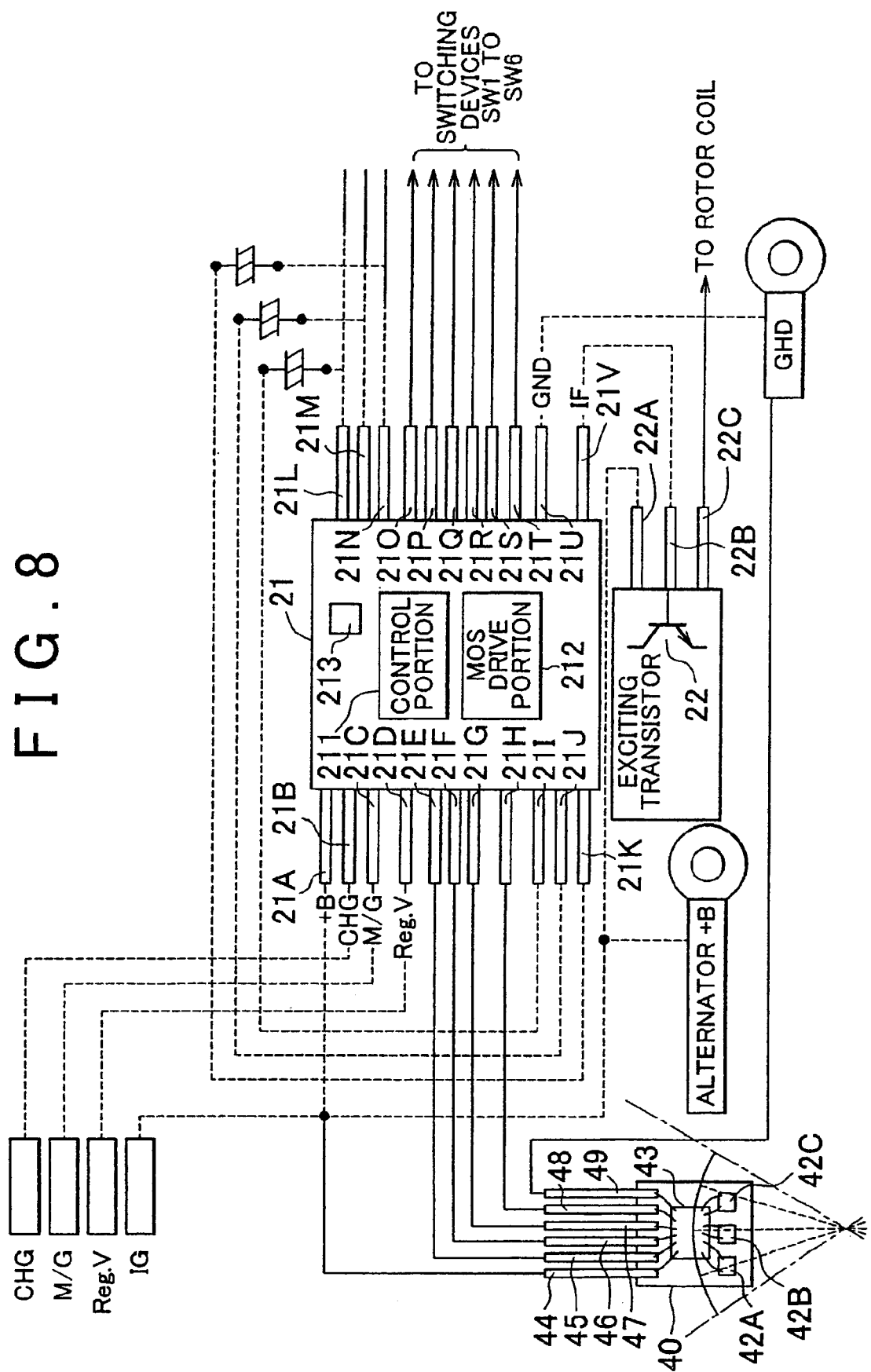
FIG. 8 is a view showing connection among the position detecting device, a control IC, and an exciting transistor.

A series of steps is thus completed. FIG. 8 is a diagram showing connection among the position detecting device 40, the control IC 21, and an exciting transistor 22. Referring to FIG. 8, the control IC 21 includes a control portion 211, a MOS drive portion 212, and a temperature sensor 213. When a start key IG of the vehicle in which the generator-motor apparatus 100 is mounted is turned ON, the control IC 21 receives a power supply current at a positive terminal voltage +B of the power supply via the terminal 21A. The power supply current is also supplied to the terminal 44 of the position detecting device 40 and a terminal 22A of the exciting transistor 22.

When the alternator 50 is not generating electric power, the control portion 211 notifies a host ECU (Electrical Control Unit) of an abnormality in the alternator 50 via a terminal 21B. When the SOC of the battery is small, the control portion 211 lights a charge lamp based on a charge lamp signal CHG received via the terminal 21B.

The control portion 211 receives a signal M/G via a terminal 21C, and controls the switching devices SW1 to SW6 based on the received signal M/G, so as to operate the alternator 50 as an electric motor or an electric power generator.

Further, the control portion 211 receives an adjustment command voltage Reg. V via a terminal 21D, and controls the switching devices SW1 to SW6 so as to output the received adjustment command voltage Reg. V to the alternator 50.

Further, the control portion 211 receives a waveform of electricity generated by each phase of the alternator 50 via terminals 21L, 21M, and 21N, and determines whether the alternator 50 generates electric power normally, based on the received wave form. The terminals 21L, 21M and 21N are connected to terminals 21I, 21J, and 21K, respectively, via a condenser.

Further, the control portion 211 outputs a control signal for controlling the gate of the exciting transistor 22 to a terminal 22B of the exciting transistor 22 via a terminal 21V. Namely, the control portion 211 controls the amount of electric power generated by the alternator 50 via the terminal 21V.

The MOS drive portion 212 outputs the reference value, which is used for converting the position detection signals θu, θv, and θw detected by the hall elements 42A, 42B and 42C into the position detection signals Hu, Hv, and Hw having a rectangle waveform, to the terminal 48 of the position detecting device 40 via a terminal 21H.

The MOS drive portion 212 receives the detection signals Hu, Hv and Hw from the position detecting device 40 via terminals 21E, 21F and 21G, and generates drive signals for driving the switching devices SW1 to SW6 in synchronization with the rising timing and the falling timing of each of the received position detection signals Hu, Hv and Hw. The MOS drive portion 212 outputs the generated drive signals to the switching devices SW1 to SW6 via terminals 21O, 21P, 21Q, 21R, 21S and 21T, respectively.

The temperature sensor 213 detects the temperature of the control IC 21, and outputs the detected temperature to an after-mentioned eco-run ECU 230.

A terminal 21U is connected to a ground GND. The exciting transistor 22 receives a power supply current via the terminal 22A. The exciting transistor 22 supplies a direct current corresponding to the control signal received by the gate via the terminal 22B to the rotor coil 54 of the alternator 50 from the terminal 21C.

Figure 9:
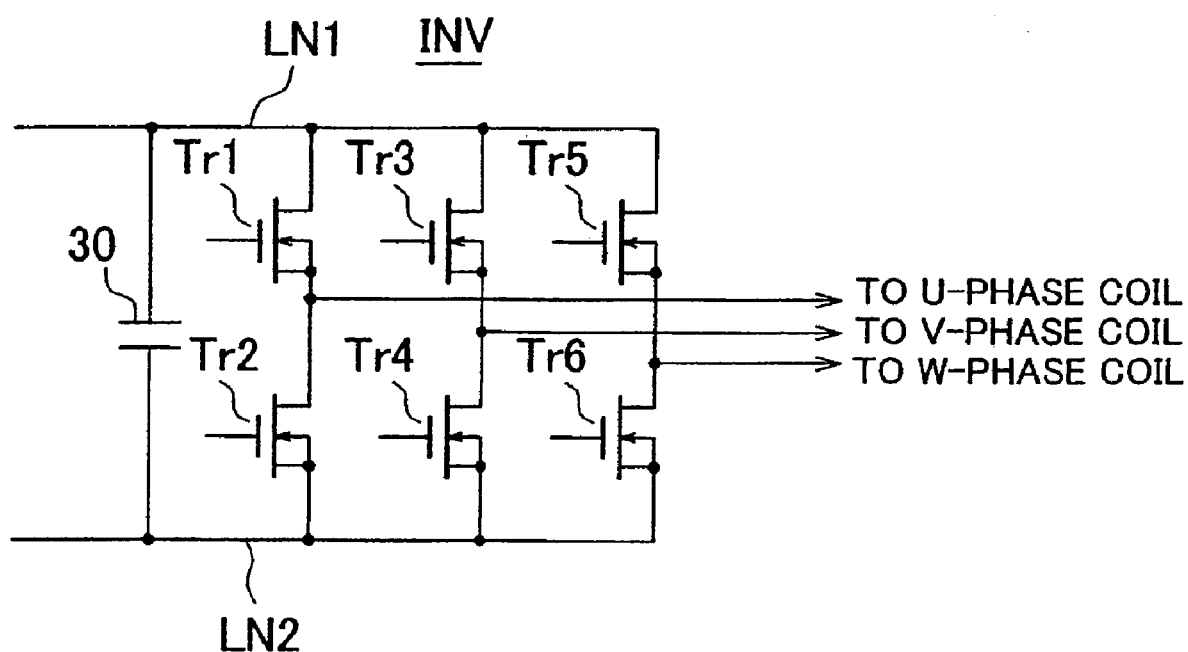
FIG. 9 is a circuit diagram showing switching devices SW1 to SW6 and electrode plates shown in FIG. 1.

FIG. 9 is a circuit diagram showing switching devices SW1 to SW6 and electrode plates 83 and 84 shown in FIG. 1. FIG. 9 shows the MOS transistors Tr1 to Tr6 included in the switching devices SW1 to SW6, respectively.

The MOS transistors Tr1 and Tr2 are connected to each other in series between a power supply line LN1 constituted of the electrode plate 83 and an earth line LN2 constituted of the electrode plate 84. Similarly, the MOS transistors Tr3 and Tr4 are connected to each other in series between the power supply line LN1 and the earth line LN2, and the MOS transistors Tr5 and Tr6 are connected to each other in series between the power supply line LN1 and the earth line LN2.

The pair of the MOS transistors Tr1 and Tr2, the pair of the MOS transistors Tr3 and Tr4, and the pair of the MOS transistors Tr5 and Tr6 are connected in parallel, between the power supply line LN1 and the earth line LN2.

The U-phase coil of the alternator 50 is connected to a point located midway between the MOS transistor Tr1 and the MOS transistor Tr2. The V-phase coil of the alternator 50 is connected to a point located midway between the MOS transistor Tr3 and the MOS transistor Tr4. The W-phase coil of the alternator 50 is connected to a point located midway between the MOS transistor Tr5 and the MOS transistor Tr6.

The condenser 30 is connected to the input side of the MOS transistors Tr1 to Tr6. The condenser 30 removes a ripple current.

The MOS transistors Tr1 to Tr6 constitute an inverter INV. In the inverter INV, the MOS transistors Tr1 to Tr6 are turned ON/OFF according to the drive signals from the terminals 21O, 21P, 21Q, 21R, 21S and 21T of the control IC 21, whereby the alternator 50 is driven as an electric motor.

When the alternator 50 serves as an electric power generator, the inverter INV converts an alternating voltage generated by the alternator 50 into a direct-current voltage, and supplies the direct-current voltage to the battery. In the case where loss of electric power during conversion from an alternating voltage to a direct-current voltage is reduced, the inverter INV turns the MOS transistors Tr1 to Tr6 ON/OFF, thereby converting an alternating voltage to a direct-current voltage. In the other cases, an alternating voltage is converted into a direct-current voltage by virtual diodes of the MOS transistors Tr1 to Tr6.

The MOS transistors Tr1 and Tr2 connected to each other in series constitute one arm, the MOS transistors Tr3 and Tr4 connected to each other in series constitute one arm, and the MOS Tr5 and Tr6 connected to each other in series constitute one arm. Namely the inverter INV is constituted of three arms.

In the embodiment, the number of the arms is not limited to three. Generally, the number of the arms is decided according to the number of the phases of the alternator 50. Therefore, when the alternator 50 includes a plurality of phases, the inverter INV includes a plurality of arms.

Figure 10:
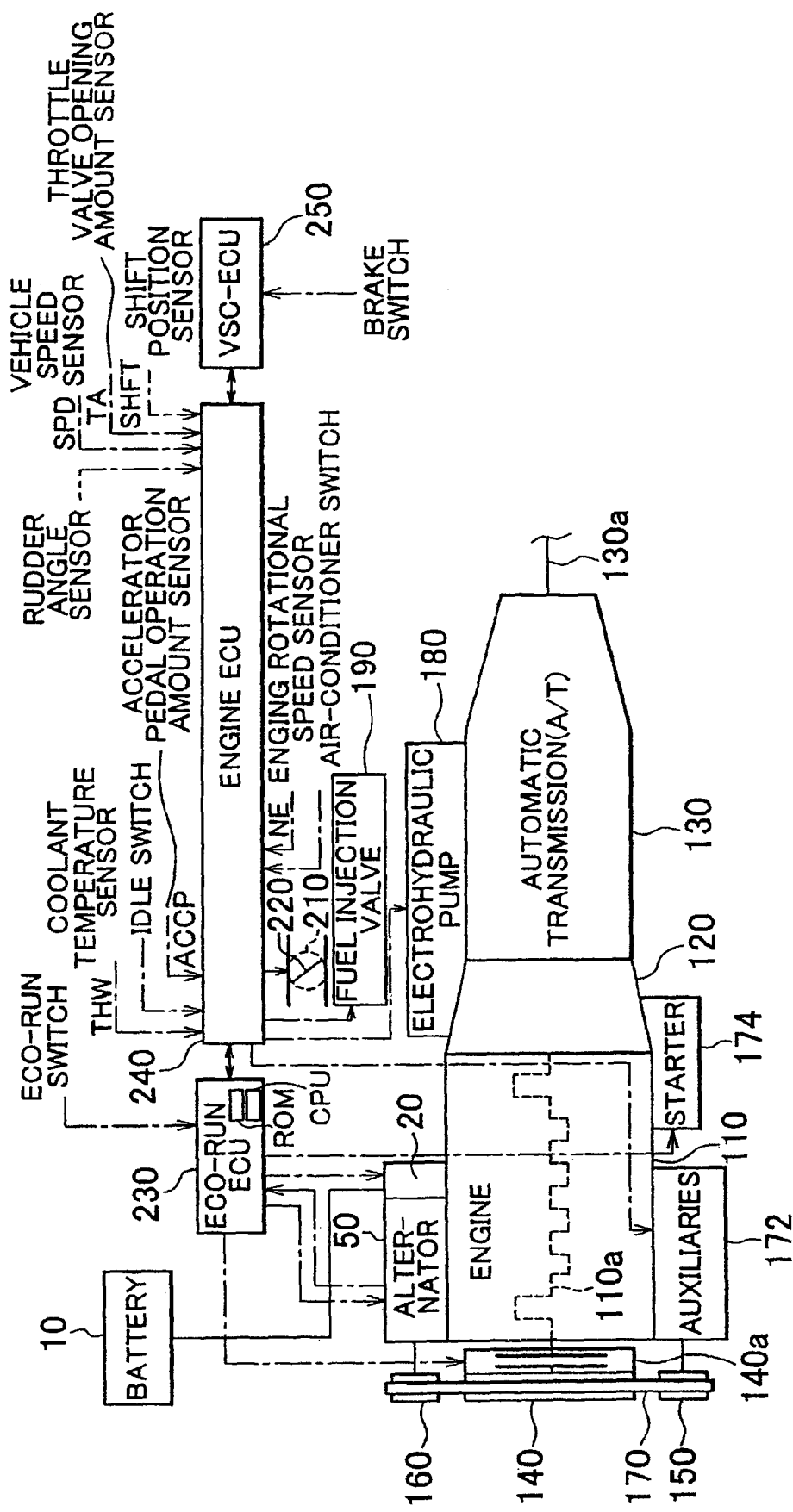
FIG. 10 is a block diagram showing an engine system including the generator-motor apparatus shown in FIG. 1.

FIG. 10 is a block diagram of an engine system 200 including the generator-motor apparatus shown in FIG. 1. Referring to FIG. 10, the engine system 200 includes the battery 100, the control circuit 20, the alternator 50, an engine 110, a torque converter 120, an automatic transmission 130, pulleys 140, 150, and 160, a belt 170, auxiliaries 172, a starter 174, an electrohydraulic pump 180, a fuel injection valve 190, an electric motor 210, a throttle valve 220, the eco-run ECU 230, an engine ECU 240, and a VSC (Vehicle Stability Control) ECU 250.

The control circuit 20 is provided on the end surface of the alternator 50, as described above. The engine 110 is started by the alternator 50 or the starter 174, and generates a predetermined amount of output. More particularly, the engine 110 is started by the alternator 50 when being started after the stop by the economy running system (hereinafter, referred to as the "eco-run system" where appropriate). The engine 110 is started by the starter 174 when being started by the ignition key. The engine 110 transmits the generated output from a crankshaft 110a to the torque converter 120 or the pulley 140.

The torque converter 120 transmits rotation of the engine 110 from the crankshaft 110a to the automatic transmission 130. The automatic transmission 130 performs automatic shift control, and changes the torque from the torque converter 120 to torque corresponding to the shift control, and then outputs the torque to an output shaft 130a.

The pulley 140 is coupled to the crankshaft 110a of the engine 110 via an electromagnetic clutch 140a. The pulley 140 operates in accordance with the pulleys 150 and 160 via the belt 170.

The electromagnetic clutch 140a connects/disconnects the pulley 140 to/from the crankshaft 110a according to the control by the eco-run ECU 230. The belt 170 couples the pulleys 140, 150 and 160 to each other. The pulley 150 is coupled to the rotating shaft of the auxiliaries 172.

The pulley 160 is coupled to the rotating shaft of the alternator 50, and is rotated by the alternator 50 or the crankshaft 110a of the engine 110.

The auxiliaries 172 are constituted of one of or some of an air-conditioner compressor, a power steering pump and an engine cooling water pump. The auxiliaries 172 receive the output from the alternator 50 via the pulley 160, the belt 170 and the pulley 150, and are driven by the received output.

The alternator 50 is driven by the control circuit 20. The alternator 50 receives the rotating force of the crankshaft 110a of the engine 110 via the pulley 140, the belt 170 and the pulley 160, and converts the received rotating force to electric energy. Namely, the alternator 50 generates electric power using the rotating force of the crankshaft 110a. In two cases, the alternator 50 generates electric power. In one of the cases, by driving the engine 110 while a hybrid vehicle including the engine system 200 is running normally, the alternator 50 receives the rotating force of the crankshaft 110a and generates electric power. In the other case, although the engine 110 is not driven, the rotating force of drive wheels is transmitted to the crankshaft 110a while the hybrid vehicle is decelerating, and the alternator 50 receives the transmitted rotating force and generates electric power.

The alternator 50 is driven by the control circuit 20, and transmits a predetermined amount of output (power) to the pulley 160. When the engine 110 is started, the predetermined amount of output is transmitted to the crankshaft 110a of the engine 110 via the belt 170 and the pulley 140. When the auxiliaries 172 are driven, the predetermined amount of output is transmitted to the auxiliaries 172 via the belt 170 and the pulley 150.

The battery 10, for example, supplies a direct-current voltage of 12V to the control circuit 20. The control circuit 20 converts the direct-current voltage from the battery 10 to an alternating voltage according to control by the eco-run ECU 230, and drives the alternator 50 using the obtained alternating voltage. The control circuit 20 converts an alternating voltage generated by the alternator 50 to a direct-current voltage according to control by the eco-run ECU 230, and charges the battery 10 using the obtained direct-current voltage.

The starter 174 starts the engine 110 according to control by the eco-run ECU 230. The electrohydraulic pump 180 is embedded in the automatic transmission 130, and supplies hydraulic fluid to a hydraulic pressure control portion provided in the automatic transmission 130 according to control by the engine ECU 240. The hydraulic fluid is used for adjusting the operation states of a clutch, a brake and a one-way clutch in the automatic transmission 130 and changing the shift state as required, by a control valve in the hydraulic pressure control portion.

The eco-run ECU 230 performs mode control of the alternator 50 and the control circuit 20, control of the starter 174, control of the state-of-charge of the battery 10, detection of an abnormality in electric power generation by the alternator 50, control of the amount of electric power generated by the alternator 50, and detection of an abnormality in charging of the battery 10. The mode control of the alternator 50 and the control circuit 20 includes control of an electric power generation mode where the alternator 50 serves as an electric power generator and control of a drive mode where the alternator 50 serves as a drive motor. Note that the control line from the eco-run ECU 230 to the battery 10 is not shown in the figure.

The fuel injection valve 190 controls fuel injection according to control by the engine ECU 240. The electric motor 210 controls the opening amount of the throttle valve 220 according to control by the engine ECU 240. The opening amount of the throttle valve 220 is set to a predetermined value by the electric motor 210.

The engine ECU 240 performs ON/OFF control of the auxiliaries 172 other than the engine cooling water pump, drive control of the electrohydraulic pump 180, shift control of the automatic transmission 130, fuel injection control by the fuel injection valve 190, the opening amount control of throttle valve 220, performed by the electric motor 210, and the other engine control.

The engine ECU 240 detects an engine coolant temperature THW from a coolant temperature sensor, a signal indicative of whether an accelerator pedal is depressed from an idle switch, an accelerator pedal operation amount ACCP from an accelerator pedal operation amount sensor, a rudder angle of steering from a rudder angle sensor, a vehicle speed SPD from a vehicle speed sensor, a throttle valve opening amount TA from a throttle valve opening amount sensor, a shift position SHFT from a shift position sensor, an engine rotational speed NE from an engine rotational speed sensor, a signal indicative of whether ON/OFF operation is performed from an air-conditioner switch, and the other data.

The VSC-ECU 250 detects a signal indicative of whether a brake pedal is depressed from a brake switch and the other data.

Each of the eco-run ECU 230, the engine ECU 240 and the VSC-ECU 250 mainly includes a microcomputer. The CPU (Central Processing Unit) performs required computation according to a program written in an internal ROM (Read Only Memory), and the ECUs perform various types of control based on the result of the computation. The result of the computation, and the detected data can be transmitted among the eco-run ECU 230, the engine ECU 240 and the VSC-ECU 250 via data communication. The eco-run ECU 230, the engine ECU 240 and the VSC-ECU 250 can exchange data as required and perform control in accordance with each other.

As an operation of the engine system 200, known idle stop control is performed. More particularly, the engine is stopped when deceleration or stop of the vehicle is detected based on the outputs from various sensors. The engine 110 is then started by the alternator 50 when the driver intends to start the vehicle (the driver's intention can be detected based on the operation states of the brake and the accelerator pedal). In the engine system 200, the control circuit 20 for controlling the alternator 50 is provided on the end surface of the alternator 50, and drives the alternator 50 as a drive motor or an electric power generator according to an instruction from the eco-run ECU 230. When the alternator 50 is driven as a drive motor or an electric power generator, heat generated by the MOS transistors Tr1 to Tr6 of the switching devices SW1 to SW6 is transferred to the electrode plate 83 or the electrode plate 84 via the electrode 1 or the electrode 2, whereby the MOS transistors Tr1 to Tr6 are efficiently cooled.

Hereafter, description will be made on detection of an abnormality in electric power generation by the alternator 50, control of the amount of electric power generated by the alternator 50 and detection of an abnormality in charging of the battery 10 performed by the alternator 50 in the engine system 200, which are performed by the eco-run ECU 230.

Figure 11:
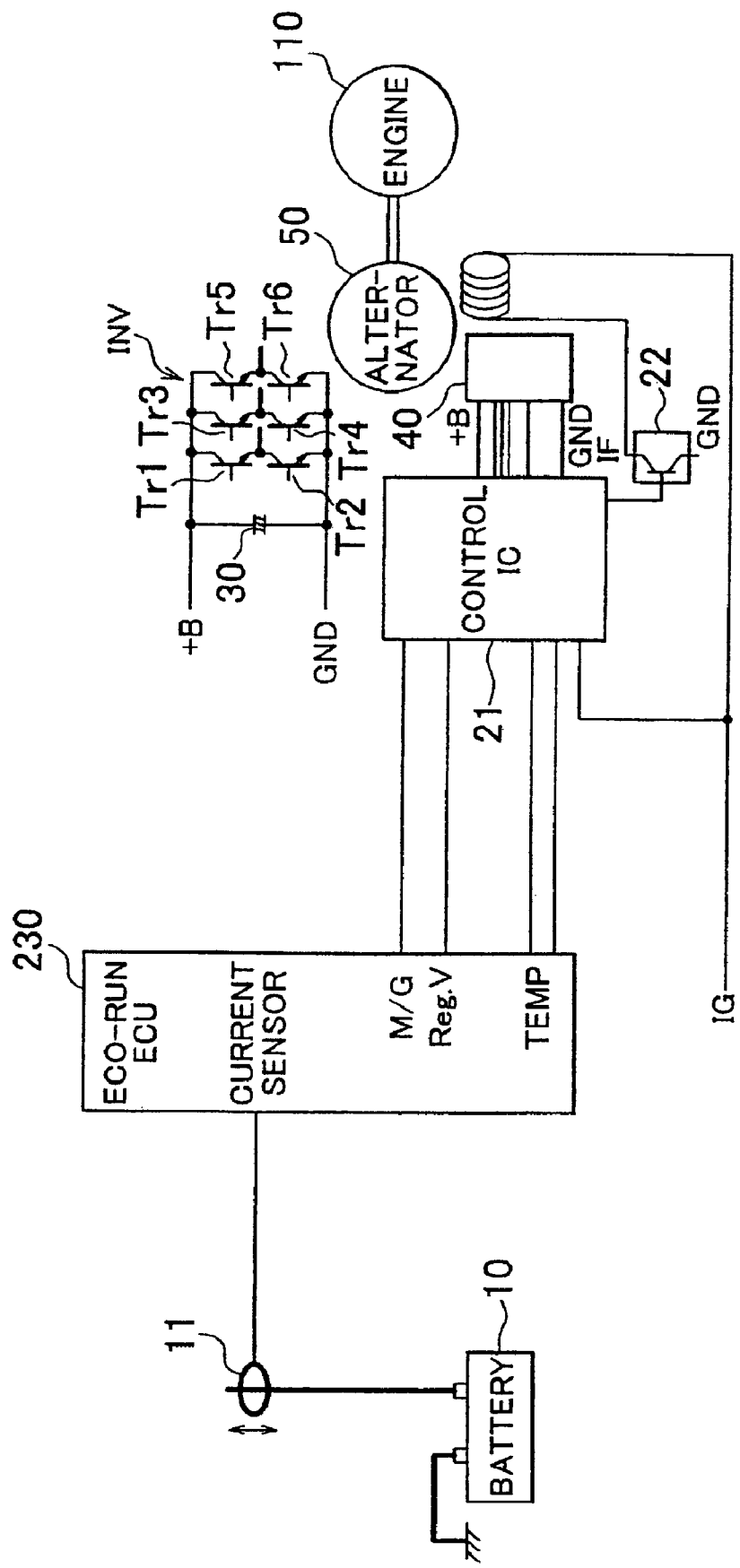
FIG. 11 is a system diagram for describing detection of an abnormality in electric power generation by the alternator, control of the amount of electric power generated by the alternator, and detection of an abnormality in battery charging.

FIG. 11 is a system diagram for describing detection of an abnormality in electric power generation by the alternator 50, control of the amount of electric power generated by the alternator 50 and detection of an abnormality in charging of the battery 10. Referring to FIG. 11, the eco-run ECU 230 receives values of the battery currents input in/output from the battery 10 from a current sensor 11. The eco-run ECU 30 accumulates the values of the battery currents, and computes the SOC (state-of-charge) of the battery 10.

A terminal TEMP receives a temperature of the control IC 21 from the temperature sensor 213 (refer to FIG. 8) provided in the control IC 21, and the eco-run ECU 230 estimates element temperatures of the switching devices SW1 to SW6 based on the received temperature. The eco-run ECU 230 stores a map showing a relationship between the temperature of the control IC 21 and the element temperature, and extracts the temperature corresponding to the temperature of the control IC 21 received from the temperature sensor 213 from the map so as to estimate the element temperatures.

The eco-run ECU 230 then performs detection of an abnormality in electric power generation by the alternator 50 and control of the amount of electric power generated by the alternator 50 based on the estimated element temperatures. The eco-run ECU 230 then performs detection of an abnormality in charging of the battery 10 based on the estimated element temperatures and the computed SOC of the battery 10.

Figure 12A:
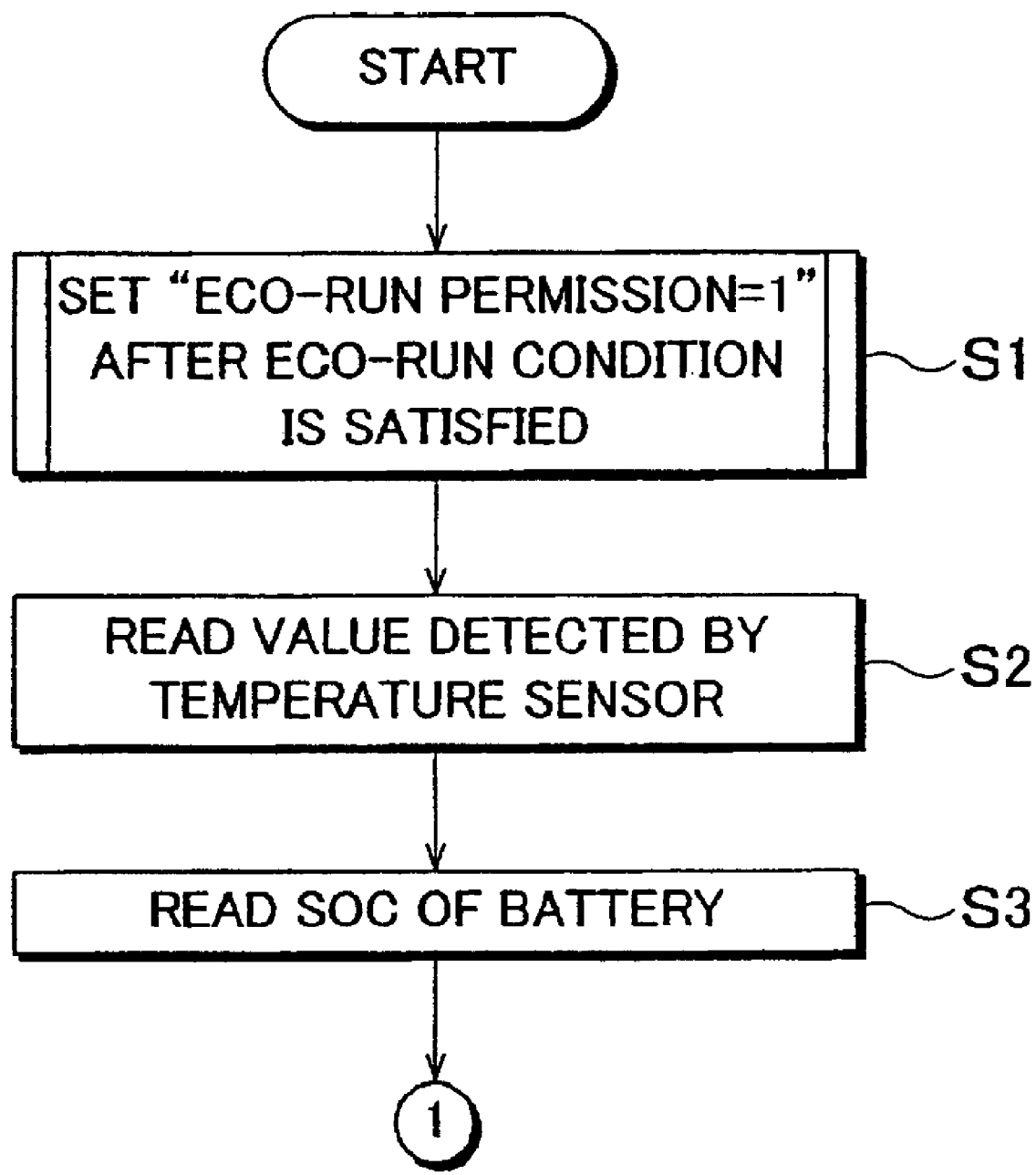
FIGS. 12A and 12B are a flowchart for describing a routine for detecting an abnormality in electric power generation by the alternator and controlling the amount of electric power generated by the alternator.
Figure 12B:
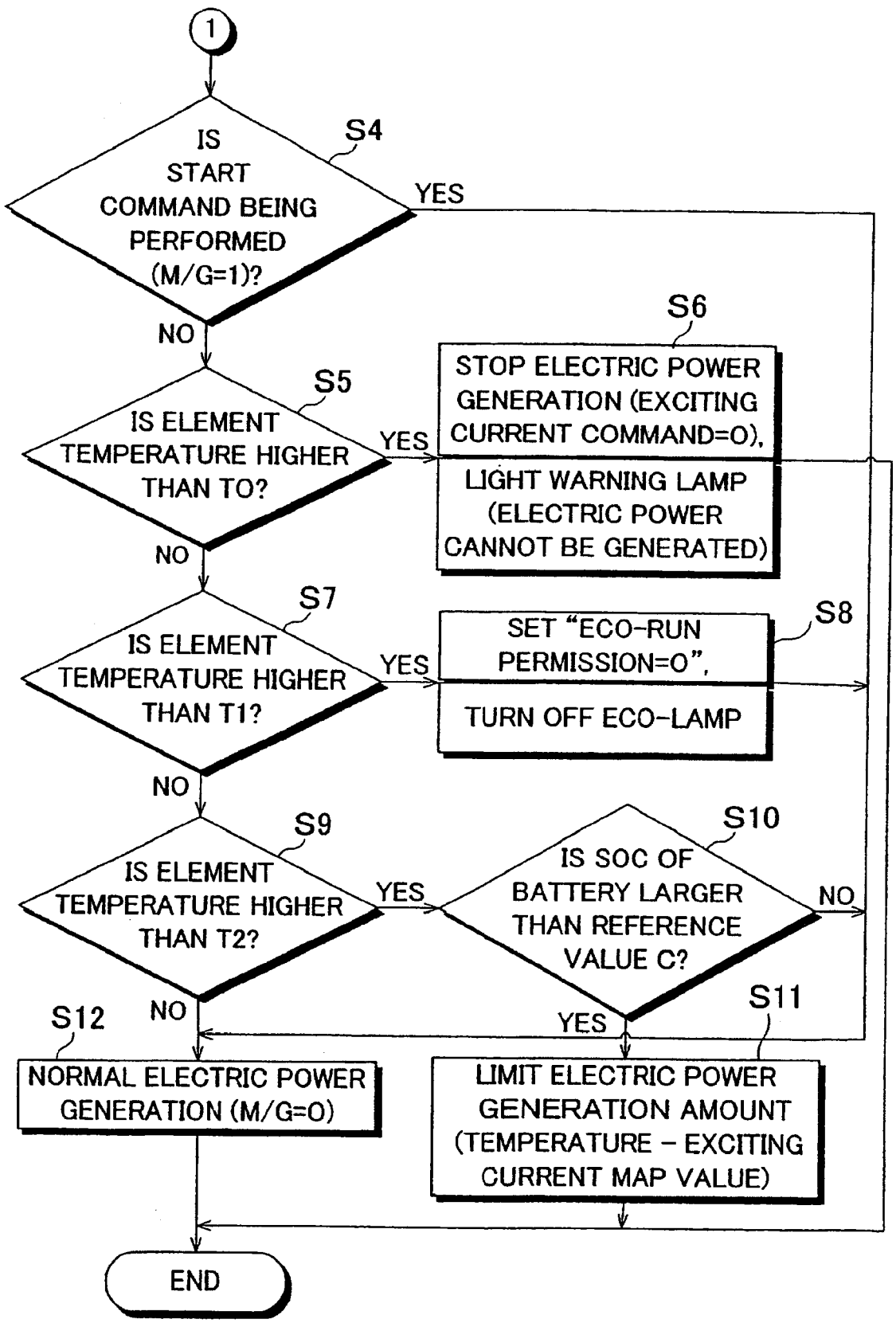

FIGS. 12A and 12B are a flowchart for describing the routine for performing detection of an abnormality in electric power generation by the alternator 50 and control of the amount of electric power generated by the alternator 50. Referring to FIGS. 12A and 12B, when the routine is started, the eco-run ECU 230 sets "eco-run permission=1" after confirming that the eco-run condition is satisfied (step S1). Namely, the eco-run ECU 230 permits operation for stopping the engine 110, when the hybrid vehicle equipped with the engine system 200 stops due to a stop light or the like.

The eco-run ECU 230 then receives the temperature of the control IC 21 from the temperature sensor 213 in the control IC 21, and estimates the element temperatures of the switching devices SW1 to SW6 corresponding to the received temperature of the control IC 21 in the above-mentioned manner (step S2). The eco-run ECU 230 then receives the values of the battery currents from the current sensor 11, and accumulates the received values of the battery currents so as to read the SOC of the battery 10 (step S3).

The eco-run ECU 230 then determines whether a start command is being performed, that is, whether the alternator 50 is operated as an electric motor and the engine 110 is being started (step S4). More particularly, the eco-run ECU 230 determines whether the engine 110 is being started based on whether a signal "M/G=1" is being output to the control IC 21.

When the eco-run ECU 20 determines that the engine 110 is being started, step S12 is then performed.

On the other hand, when the eco-run ECU 230 determines in step S4 that the engine 110 is not being started, the eco-run ECU 230 determined whether the element temperature estimated in step S2 is higher than a reference value T0 (step S5). The reference value T0 is the critical temperature at which the alternator 50 can continue serving as an electric power generator.

When the element temperature is determined to be higher than the reference value T0, the eco-run ECU 230 generates "exciting current command=0" for setting the exciting current supplied from the exciting transistor 22 to "0", and outputs it to the control IC 21. The control IC 21 then controls the exciting transistor 22 such that the exciting current becomes "0", whereby electric power generation by the alternator 50 is stopped. The eco-run ECU 230 then lights a warning lamp for notifying the driver that electric power cannot be generated (step S6), afterwhich, the routine ends.

When it is determined in step S5 that the element temperature is higher than the reference value T0, the alternator 50 is controlled such that power generation is stopped due to the following reason: if power generation by the alternator 50 is continued when the element temperature is higher than the reference value T0, the switching devices SW1 to SW6 are broken, which makes it impossible to operate the alternator 50 as an electric motor after a stop of economy running and to start the engine 110.

On the other hand, when it is determined in step S5 that the element temperature is equal to or lower than the reference value T0, the eco-run ECU 230 determines whether the element temperature is higher than a reference value T1 (<T0) (step S7). The reference value T1 is the critical temperature at which economy running is permitted.

When it is determined in step S7 that the element temperature is higher than the reference value T1, the eco-run ECU 230 sets "eco-run permission=0", and outputs this "eco-run permission =0" to the engine ECU 240 so as to prohibit economy running. Then eco-run ECU 230 then turns off an eco-run lamp, and notifies the driver that economy running is prohibited (step S8). The engine ECU 240 does not stop the engine 110 even when the hybrid vehicle is stopped, according to "eco-run permission =0" from the eco-run ECU 230. This eliminates the need for starting the engine 110 using the alternator 50 when the hybrid vehicle is started after stop of economy running, preventing the element temperatures of the switching devices SW1 to SW6 from increasing. Then, step S12 is performed.

When the element temperature is higher than the reference value T1, economy running is prohibited in order to reduce the number of times that the engine 110 is started by the alternator 50 after stop of economy running (namely, the number of times that the alternator 50 is driven as an electric motor by the switching devices SW1 to SW6), thereby preventing the element temperatures of the switching devices SW1 to SW6 from increasing.

On the other hand, when it is determined in step S7 that the element temperature is equal to or lower than the reference value T1, the eco-run ECU 230 determines whether the element temperature is higher than a reference temperature T2 (step S9). The reference temperature T2 is the critical temperature at which the amount of electric power generated by the alternator 50 is limited such that the element temperature does not exceed the reference value T1.

When it is determined that the element temperature is higher than the reference temperature T2, the eco-run ECU 230 further determines whether the SOC of the battery obtained in step S3 is larger than a reference value C (step S10). When the SOC of the battery is equal to or smaller than the reference value C, step S12 is then performed.

On the other hand, when it is determined in step S10 that the SOC of the battery is larger than the reference value C, the eco-run ECU 230 controls the control IC 21 such that the amount of electric power generated by the alternator 50 is limited (step S11). More particularly, the eco-run 230 stores a map showing a relationship between the element temperature and the exciting current command. The eco-run ECU 230 extracts the exciting current command corresponding to the element temperature obtained in step S2 using the map, and outputs the extracted exciting current command to the control IC 21. The control IC 21 controls the exciting transistor 22 such that the exciting current designated by the exciting current command from the eco-run ECU 230 flows. The amount of electric power generated by the alternator 50 is thereby limited, and the element temperatures of the switching devices SW1 to SW6 are limited to the temperature at which the alternator 50 can be operated as an electric motor and the engine 110 can be started, afterwhich the routine ends.

On the other hand, when it is determined in step S9 that the element temperature is equal to or lower than the reference value T2, the eco-run ECU 230 sets "M/G=0" and permits the alternator 50 to generate electric power normally (step S12), afterwhich the routine ends.

Figure 13:
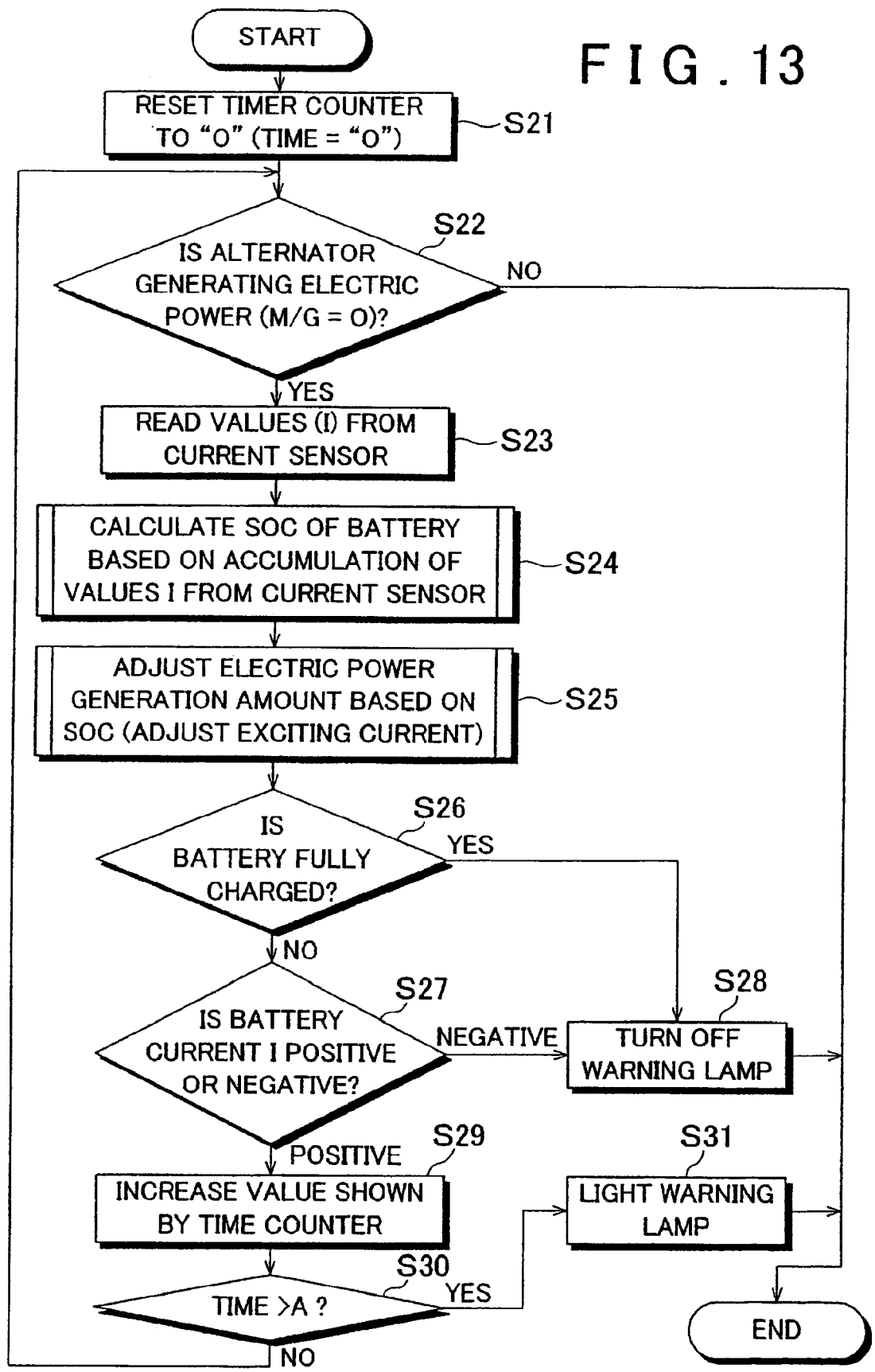
FIG. 13 is a flowchart for describing a routine for detecting an abnormality in battery charging.

FIG. 13 is a flowchart for describing the routine for detecting an abnormality in charging of the battery 10. Referring to FIG. 13, when the routine is started, the eco-run ECU 230 resets a timer counter to "0" (TIME=0) (step S21). The eco-run ECU 230 then determines whether the alternator 50 is generating electric power (step S22). More particularly, the eco-run ECU 230 determines whether the alternator 50 is generating electric power by determining whether the signal M/G is "0".

When it is determined in step S22 that the alternator 50 is not generating electric power, the routine ends.

On the other hand, when it is determined in step S22 that the alternator 50 is generating electric power, the eco-run ECU 230 reads the value of battery current I from the current sensor 11 (step S23), and accumulates the values of the battery currents I so as to compute the state-of-charge SOC of the battery 10 (step S24).

Figure 14:
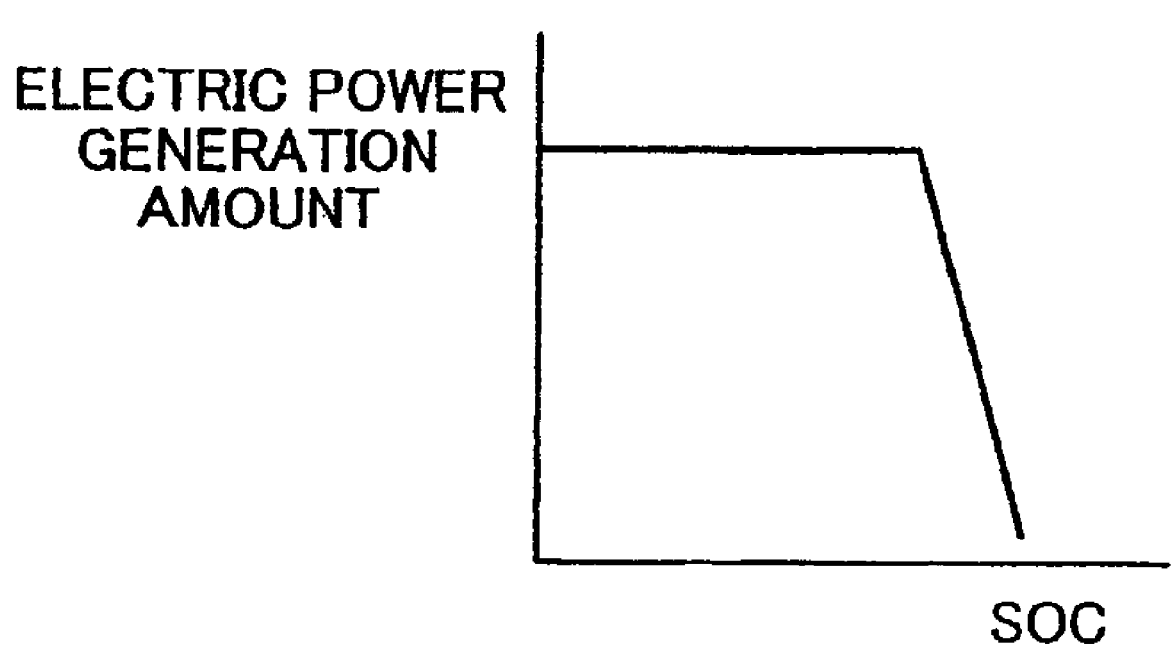
FIG. 14 is a graph showing a relationship between the amount of electric power generation and the state-of-charge of the battery.

The eco-run ECU 230 controls the control IC 21 such that the amount of electric power corresponding to the computed state-of-charge SOC is generated by the alternator 50 (step S25). The eco-run ECU 230 stores a map showing a relationship between the electric power generation amount and the state-of-charge SOC shown in FIG. 14. The eco-run ECU 230 extracts the electric power generation amount corresponding to the state-of-charge SOC computed in step S24, and controls the control IC 21 such that the extracted amount of electric power is generated by the alternator 50.

The eco-run ECU 230 determines whether the state-of-charge SOC has reached the full charge (step S26). When it is determined that the state-of-charge SOC has reached the full charge, the eco-run ECU 230 turns off the warning lamp (step S28), afterwhich the routine ends.

On the other hand, when it is determined in step S26 that the state-of-charge SOC has not reached the full charge, the eco-run ECU 230 determines whether the battery current I is positive or negative (step S27). In this case, the fact that the battery current I is positive signifies that the battery current I is discharged from the battery 10, and the fact that the battery current I is negative signifies that the battery current I is charged into the battery 10.

When it is determined in step S27 that the battery current I is negative, the eco-run ECU 230 turns off the warning lamp (step S28), afterwhich the routine ends.

On the other hand, when it is determined in step S28 that the battery current I is positive, the eco-run ECU 230 increases the value shown by the timer counter (step S29), and determines whether the obtained timer count value TIME is larger than a reference value A (step S30). The reference value A is the critical value of time at which it is determined that the battery 10 is not charged.

When it is determined in step S30 that the timer count value TIME is larger than the reference value A, the eco-run ECU 230 determines that the battery 10 is not charged, and lights the warning lamp (step S31), afterwhich the routine ends.

On the other hand, when it is determined in step S30 that the timer count value TIME is equal to or smaller than the reference value A, steps S22 to S30 are repeatedly performed.

Detection of an abnormality in power generation by the alternator 50 and control of the amount of electric power generated by the alternator 50 in the eco-run ECU 230 are actually performed by the CPU. The CPU reads the program including the steps shown in the flowchart in FIGS. 12A and 12B from the ROM, and performs the steps in FIGS. 12A and 12B so as to perform detection of an abnormality in power generation by the alternator 50 and control of the amount of electric power generated by the alternator 50.

Accordingly, the ROM can be regarded as a computer (CPU)-readable recording medium on which the program for directing the computer (CPU) to perform detection of an abnormality in electric power generation by the alternator 50 and control of the amount of electric power generated by the alternator 50 is recorded.

Detection of an abnormality in charging of the battery 10 in the eco-run ECU 230 is actually performed by the CPU. The CPU reads the program including the steps shown in the flowchart in FIG. 13 from the ROM, and performs the steps in FIG. 13 so as to detect an abnormality in charging of the battery 10.

Accordingly, the ROM can be regarded as a computer (CPU)-readable recording medium on which the program for directing the computer (CPU) to perform detection of an abnormality in charging of the battery 10 is recorded.

As described above, the eco-run ECU 230 estimates the element temperatures of the switching devices SW1 to SW6 based on the temperature detected by the temperature sensor 213 provided in the control IC 21 of the generator-motor apparatus 100. The ECU 230 then performs detection of an abnormality in electric power generation by the alternator 50 and control of the amount of electric power generated by the alternator 50 based on the estimated element temperatures.

The eco-run ECU 230 detects an abnormality in charging of the battery 10 based on the value of the battery current from the current sensor 11 provided near the battery 10.

Therefore, instead of a microcomputer performing detection of an abnormality in electric power generation by the alternator 50, control of the amount of electric power generated by the alternator 50, and detection of an abnormality in charging of the battery 10, the above-mentioned one IC chip (the control IC 21) is provided on the end surface of the alternator, enabling a reduction in size of the generator-motor apparatus 100. As a result, the mountability of the generator-motor apparatus 100 is improved.

In the above description, the positional relationship between the alternator 50 and the engine 110 is not described in detail. When the engine 110 is started by "ignition combined start", the position where the alternator 50 is provided is not limited.

The "ignition combined start" signifies the state where fuel is compressed in a cylinder of the engine 110 and ignited, the crankshaft starts rotating, and the rotation is assisted by torque of the electric motor so as to facilitate the start of the engine 110. In this case, the electric motor outputs toque smaller than that in a normal state.

Accordingly, when the engine 110 is started by the "ignition combined start", the output torque of the alternator 50 is transmitted to the crankshaft 110a of the engine 110 via the belt 170. Therefore, the position where the alternator 50 is provided is not limited.

On the other hand, when the engine 110 is started without using the "ignition combined start", the alternator 50 needs to output large toque. Therefore, the alternator 50 is provided near the engine 110.

The alternator 50 can be regarded as a "motor" which includes a stator and a rotor and serves as an electric power generator and an electric motor.

Each of the pairs of the switching devices SW1 and SW2, the switching devices SW3 and SW4, and the switching devices SW5 and SW6 can be regarded as a "multi-phase switching element group".

The eco-run ECU 230 and the generator-motor apparatus 100 can be regarded as a "drive system".

Further, the eco-run ECU 230 can be regarded as a "control device" which controls the generator-motor apparatus 100.

While the invention has been described with reference to exemplary embodiments thereof, is to be understood that the invention is not limited to the exemplary embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

The invention claimed is:

1. A generator-motor apparatus, comprising:
   a motor which includes a rotor and a stator, and serves as an electric power generator and an electric motor;
   a first electrode plate and a second electrode plate which are arranged on an end surface of the motor, and formed in a substantial horseshoe shape so as to surround a rotating shaft of the motor; and
   a multi-phase switching element group which controls an electric current supplied to the stator, wherein the number of the multi-phase switching element groups corresponds to the number of phases of the motor; each multi-phase switching element group includes a plurality of arms each of which includes a first switching device and a second switching device that are electrically connected to each other in series between the first electrode plate and the second electrode plate; a plurality of the first switching devices is directly attached to the first electrode plate; a plurality of the second switching devices is directly attached to the second electrode plate; and each of the plurality of the first switching devices and the second switching devices includes a first electrode, a second electrode, a switching element electrically connected to the first electrode and the second electrode and sandwiched between the first electrode and the second electrode, and a sealing member which is provided around the switching element and which contacts the first electrode and the second electrode.

2. The generator-motor apparatus according to claim 1, further comprising:
a control circuit which controls the multi-phase switching element group; and
a bus bar which connects the plurality of the first switching devices and the plurality of the second switching devices to the control circuit, wherein the bus bar is formed by insert molding.

3. The generator-motor apparatus according to claim 1, further comprising:
a temperature sensor which is provided inside the control circuit, and which detects a temperature of the control circuit, wherein the temperature of the control circuit actually detected by the temperature sensor is used for detecting a temperature of the switching element.

4. The generator-motor apparatus according to claim 3, wherein the temperature of the switching element is detected by extracting the temperature of the switching element corresponding to the temperature of the control circuit actually detected by the temperature sensor, with reference to a map showing a relationship between the temperature of the control circuit and the temperature of the switching element.

5. The generator-motor apparatus according to claim 1, wherein the multi-phase switching element group controls an electric current supplied to the stator such that the motor outputs predetermined torque when an internal combustion engine is ignited, and the motor outputs the predetermined torque, and transmits the predetermined torque to the internal combustion engine via a belt.

6. The generator-motor apparatus according to claim 1, further comprising:
a control circuit which controls the multi-phase switching element group; and
a temperature sensor which is arranged on one of the first electrode plate and the second electrode plate, and which detects an ambient temperature of the electrode plate on which the temperature sensor is arranged, wherein the control circuit detects a temperature of the switching element based on the ambient temperature actually detected by the temperature sensor.

7. The generator-motor apparatus according to claim 6, wherein the control circuit stores a map showing a relationship between the ambient temperature and the temperature of the switching element, and detects the temperature of the switching element by extracting the temperature of the switching element corresponding to the ambient temperature actually detected by the temperature sensor using the map.

8. The generator-motor apparatus according to claim 1, wherein the plurality of the first switching devices and the second switching devices are provided between the first electrode plate and the second electrode plate.

9. The generator-motor apparatus according to claim 8, wherein the plurality of the first switching devices and the plurality of the second switching devices are alternately disposed.

10. A drive system, comprising:
the generator-motor apparatus according to claim 1; and
a control device which controls the generator-motor apparatus, wherein the generator-motor apparatus starts an internal combustion engine and generates electric power using engine torque; and the control device outputs a signal for prohibiting an automatic stop of the internal combustion engine to an internal combustion engine control device for controlling the internal combustion engine, when a temperature of the switching element is higher than a predetermined temperature.

11. A drive system, comprising:
the generator-motor apparatus according to claim 1; and
a control device which controls the generator-motor apparatus, wherein the generator-motor apparatus starts an internal combustion engine and generates electric power using engine torque; and the control device controls an amount of electric power generated by the motor such that a temperature of the switching element becomes a temperature at which starting of the internal combustion engine is permitted.

12. A computer-readable recording medium on which a program for directing a computer to perform control of the generator-motor apparatus according to claim 1 is recorded, wherein the generator-motor apparatus starts an internal combustion engine; and the program directs the computer to perform a first step for detecting a temperature of the switching element when the motor generates electric power, a second step for determining whether the detected temperature of the switching element is higher than a first reference value, and a third step for prohibiting an automatic stop of the internal combustion engine when the temperature of the switching element is higher than the first reference value.

13. The recording medium according to claim 12, wherein the recording medium stores the program for directing the computer to further perform a fourth step for detecting a remaining capacity of a battery, a fifth step for determining whether the temperature of the switching element is higher than a second reference value when the temperature of the switching element is equal to or lower than the first reference value, a sixth step for determining whether the remaining capacity of the battery is larger than a reference capacity when the temperature of the switching element is higher than the second reference value, and a seventh step for limiting an amount of electric power generated by the motor such that the temperature of the switching element becomes equal to or lower than the second reference value when the remaining capacity of the battery is larger than the reference capacity.

14. The recording medium according to claim 12, wherein the recording medium stores the program for directing the computer to further perform an eighth step for lighting an alarm light when the remaining capacity of the battery does not increase even if a predetermined time has elapsed since the motor starts electric power generation.

* * * * *

UNITED STATES PATENT AND TRADEMARK OFFICE
CERTIFICATE OF CORRECTION

PATENT NO. : 7,759,831 B2  Page 1 of 1
APPLICATION NO. : 12/265536
DATED : July 20, 2010
INVENTOR(S) : Katsunori Yagi It is certified that error appears in the above-identified patent and that said Letters Patent is hereby corrected as shown below:

In the Title Page: Change the information under "Related U.S. Application Data"
to read as follows:

--(62)  Division of application No. 10/555,944 filed November 7, 2005, now U.S. Patent No. 7,456,531, which is a 371 national phase application of PCT/IB2004/002211 filed July 5, 2004.--

Signed and Sealed this
First Day of February, 2011

David J. Kappos
*Director of the United States Patent and Trademark Office*